(12) United States Patent
Taniguchi et al.

(10) Patent No.: US 11,762,118 B2
(45) Date of Patent: Sep. 19, 2023

(54) METAL DETECTION APPARATUS

(71) Applicant: ANRITSU CORPORATION, Kanagawa (JP)

(72) Inventors: Eiji Taniguchi, Kanagawa (JP); Chie Nishimura, Kanagawa (JP); Yuki Hayakawa, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 25 days.

(21) Appl. No.: 17/597,058

(22) PCT Filed: May 19, 2020

(86) PCT No.: PCT/JP2020/019753
§ 371 (c)(1),
(2) Date: Dec. 23, 2021

(87) PCT Pub. No.: WO2020/261818
PCT Pub. Date: Dec. 30, 2020

(65) Prior Publication Data
US 2022/0268960 A1 Aug. 25, 2022

(30) Foreign Application Priority Data

Jun. 27, 2019 (JP) .................................. 2019-119667
Jun. 27, 2019 (JP) .................................. 2019-119668

(51) Int. Cl.
*G01V 3/10* (2006.01)
*G01R 33/10* (2006.01)
(Continued)

(52) U.S. Cl.
CPC ............... *G01V 3/10* (2013.01); *G01N 27/72* (2013.01); *G01R 33/10* (2013.01); *G01V 3/081* (2013.01); *G01V 3/38* (2013.01)

(58) Field of Classification Search
CPC . G01V 3/10; G01V 3/081; G01V 3/38; G01N 27/72; G01R 33/10; G01R 33/0029; G01R 33/028; G01R 33/12
(Continued)

(56) References Cited

U.S. PATENT DOCUMENTS

| 6,172,504 B1* | 1/2001 | Earle ........................ G01V 3/10 |
| | | 324/329 |
| 2004/0047106 A1* | 3/2004 | Maruyama ............... G07D 5/08 |
| | | 361/143 |

(Continued)

FOREIGN PATENT DOCUMENTS

| JP | S57-192485 U | 12/1982 |
| JP | 2005-214936 A | 8/2005 |

(Continued)

OTHER PUBLICATIONS

International Search Report dated Jul. 7, 2020 issued in Patent Application No. PCT/JP2020/019753.
(Continued)

*Primary Examiner* — Christopher P McAndrew
(74) *Attorney, Agent, or Firm* — Pearne & Gordon LLP

(57) ABSTRACT

A metal detection apparatus that can accurately and automatically determine whether a metal passing through the inspection area is a magnetic or non-magnetic metal comprises a detection unit quadrature-detecting a differential detection signal of magnetic field fluctuation in the inspection area due to the passage of a workpiece, and a determination unit that determines the presence or absence of a mixed metal based on both fluctuation components after the detection. The determination unit compares sample signal phase data obtained beforehand from the detection signal of the magnetic field fluctuation in the inspection area due to the passage of various metal samples, with the signal phase data obtained from the detection signal of the magnetic field (Continued)

fluctuation in the inspection area due to the passage of the workpiece mixed with metal, and determines the type of metal passing through the inspection area based on the phase determination result.

22 Claims, 13 Drawing Sheets

(51) Int. Cl.
*G01V 3/08* (2006.01)
*G01V 3/38* (2006.01)
*G01N 27/72* (2006.01)

(58) Field of Classification Search
USPC .......................................... 324/228
See application file for complete search history.

(56) References Cited

U.S. PATENT DOCUMENTS

| | | | |
|---|---|---|---|
| 2006/0226833 A1 | 10/2006 | Kubotera et al. | |
| 2013/0113648 A1* | 5/2013 | Duvoisin, III | G01S 7/354 |
| | | | 342/22 |
| 2013/0234716 A1* | 9/2013 | Candy | G01V 3/10 |
| | | | 324/326 |
| 2015/0234075 A1* | 8/2015 | Moore | G01V 3/10 |
| | | | 324/225 |

FOREIGN PATENT DOCUMENTS

| | | |
|---|---|---|
| JP | 2005-345433 A | 12/2005 |
| JP | 2005-345434 A | 12/2005 |
| JP | 2010-156643 A | 7/2010 |
| WO | 2004-086095 A1 | 10/2004 |
| WO | WO-2008101270 A1 * 8/2008 | ............ B07C 5/344 |

OTHER PUBLICATIONS

Written Opinion dated Jul. 7, 2020 issued in Patent Application No. PCT/JP2020/019753.

* cited by examiner

METAL DETECTION APPARATUS

BACKGROUND OF THE INVENTION

Field of the Invention

This present invention relates to a metal detection apparatus, and in particular to a metal detection apparatus for detecting metals or metal components in an object to be inspected based on the magnetic field fluctuation when the object to be inspected passes through an alternating magnetic field.

Description of the Related Art

The property of a metal to change the external magnetic field is remarkable in magnetic metal when the amplitude (magnetic flux density) of the magnetic field is maximum, and it is remarkable in non-magnetic metal when the amount of change in magnetic flux density is maximum. Therefore, there have conventionally been a metal detection apparatus that can detect not only magnetic metals but also non-magnetic metals by generating an alternating magnetic field in the inspection area of the object to be inspected, detecting the fluctuation of the magnetic field due to the influence of the object to be inspected moving in the inspection area, and applying quadrature detection processing to the detection signal (see, for example, Patent Document 1).

It is also known that the detection sensitivity of the metal detecting unit is set based on the type and size of a metal foreign object specified in the operation input and the estimated detection sensitivity of the plurality of metal foreign objects by the control arithmetic unit (see, for example, Patent Document 2).

In addition, there is a known method for detecting contaminant metals with high sensitivity by adjusting the phase shift so that the detection phase of one of the two is slightly different from the reference signal, obtaining the magnetic field fluctuation signal data for both the contaminant and the good samples, and determining the optimal detection phase by determining the phase shift amount that has the maximum ratio of the amplitude value of the contaminant sample to the amplitude value of the good sample (see, for example, Patent Document 3).

CITATION LIST

Patent Literature

Patent Document 1: Japanese Patent Application Laid-Open No. 2005-214936
Patent Document 2: Japanese Patent Application Laid-Open No. 2005-345433
Patent Document 3: WO2004/086095

SUMMARY OF THE INVENTION

Technical Problem

However, in the conventional metal detection apparatus described above, the magnetic field fluctuation component with a large metal influence was detected by quadrature detection of the fluctuation signal of the alternating magnetic field in the inspection area caused by the passage of the object to be inspected with a detection phase that suppresses the influence of the object to be inspected itself.

Therefore, when the detection sensitivity of non-magnetic metals is increased, for example, by increasing the magnetic field frequency, the influence of the magnetic and non-magnetic metals may come close together, making it difficult to accurately distinguish between magnetic and non-magnetic metals.

In addition, it was not possible to accurately discriminate multiple types of non-magnetic metals with different degrees of non-magnetism and materials.

In addition, the metal contained in the object to be inspected may be a metal foreign object that has fallen out of the upstream apparatus that handles the object to be inspected upstream of the metal detection apparatus. In this case, if the type of the contaminated metal can be identified, it is possible to estimate the upstream apparatus from which the metal was removed. However, as mentioned above, it was difficult to estimate the upstream apparatus from which the contaminant was removed because the metal type determination function was not sufficient.

The object of the present invention is to provide a metal detection apparatus that can accurately and automatically determine whether a metal passing through the inspection area is a magnetic or non-magnetic metal, and to provide a metal detection apparatus that can accurately distinguish multiple types of foreign substances, even non-magnetic metals, which have different degrees of non-magnetism and materials, in order to solve the conventional problems described above.

Means to Solve the Problem (1) In order to achieve the above object, the present invention provides a metal detection apparatus, comprising: a magnetic field generator that generates an alternating magnetic field based on a reference signal in an inspection area through which an object to be inspected passes; a magnetic field detection unit that detects the fluctuation of the alternating magnetic field in the inspection area due to the passage of the object to be inspected and outputs a magnetic field fluctuation signal; a detection circuit unit that performs detection processing to detect first fluctuation component of the magnetic field fluctuation signal on the in-phase side of the reference signal and second fluctuation component of the magnetic field fluctuation signal on the quadrature phase side of the reference signal at two detection phases that are quadrature to each other; and a determination unit that executes a determination process to detect metals contained in the object to be inspected based on the first fluctuation component and the second fluctuation component detected by the detection circuit unit, wherein the determination unit has a phase determination unit determining the difference between sample signal phase data obtained in advance from the magnetic field fluctuation signal detected by passing through various metal samples out of the metal samples of various types, and a signal phase data of the object to be inspected obtained from the magnetic field fluctuation signal detected by passing through the object to be inspected in which a metal is contained, and a metal type determination unit determining the type of the metal contained in the object to be inspected based on the determination result of the phase determination unit.

By this configuration, in the present invention, a first fluctuation component of the magnetic field fluctuation signal is detected by the detection circuit unit on the in-phase side of the reference signal and a second fluctuation component of the magnetic field fluctuation signal on the quadrature phase side of the reference signal, respectively, and the determination unit executes the determination process to detect the metal contained in the object to be inspected based on the first and second fluctuation components. In addition, the phase of the metal influence signal accompanying the fluctuation of the alternating magnetic field in the inspection area caused by the passage of various metal samples among the multiple types of metal samples is acquired in advance as sample signal phase data, and when the object to be inspected contained with metal actually passes through the inspection area, the difference between the sample signal phase data and the signal phase data of the object to be inspected obtained based on the magnetic field fluctuation signal at that time is determined, so that the type of metal passing through the inspection area is determined based on the determination result. Therefore, it is possible to accurately and automatically determine whether the metal passing through the inspection area is a magnetic or non-magnetic metal. It is also possible to accurately distinguish multiple types of metals with different degrees of non-magnetism and materials, even if they are non-magnetic.

(2) In the metal detection apparatus according to the present invention, the determination unit may further comprise an amplitude determination unit determining the difference between sample signal amplitude data obtained in advance from the magnetic field fluctuation signal detected by passing through the plurality of metal samples of the same type with different sizes for each type of the plurality of metal samples and a signal amplitude data of the object to be inspected obtained from the magnetic field fluctuation signal detected by passing through the object to be inspected in which the metal is contained, and the type and size of the metal contained into the object to be inspected are determined based on the determination result of the amplitude determination unit. Therefore, it is possible to determine the type and size of the detected metal.

(3) In the metal detection apparatus according to the present invention, the metal type determination unit may discriminate the type and size of the metal based on boundary information of the distribution area on orthogonal coordinates set in advance based on the sample signal phase data and the sample signal amplitude data obtained in advance for the said plural metal samples of the same type, the signal phase data of the object to be inspected and the signal amplitude data of the object to be inspected. In this case, the type and size of the detected metal can be determined quickly and accurately.

The boundary information of the distribution area in the orthogonal coordinates may be shown in a map region corresponding to the orthogonal coordinates of the entire fluctuation region in the specific detection phase of the magnetic field fluctuation signal, and may have a curved curve shape so that the phase angle becomes larger on the side of high amplitude (the side where the two components of the orthogonal coordinates become larger) than on the side of low amplitude of the detection signal of the specific article on the map region. Alternatively, the boundary information of the distribution area on the orthogonal coordinates may be shown in a map region corresponding to the orthogonal coordinates of the entire fluctuation region in the specific detection phase of the magnetic field fluctuation signal, and may be identified by a boundary calculation formula identifying a fluctuation point on a curved boundary line such that the phase angle becomes larger on the high amplitude side than the low amplitude side of the detection signal of the specific article on the map region.

(4) In the metal detection apparatus according to the present invention, the phase determination unit of the determination unit may store determination conditions for determining differences in the sample signal phase data for each plurality of frequency bands set for the frequency of the reference signal, and determines the type of metal passing through the inspection area based on the determination conditions. In this case, the phase change of the metal influence signal in response to the change in the frequency of the reference signal can be detected, and the type of metal can be determined more accurately.

(5) In the metal detection apparatus according to the present invention, may further comprising a statistics and history processing unit that executes statistics and history processing of the object to be inspected that has passed through the inspection area based on the determination results of the determination unit. In this way, it is possible to generate statistics and history information including the type of the metal at the time of contamination, and more useful statistics and history information can be obtained.

(6) In the metal detection apparatus according to the present invention, the inspection area may be disposed downstream from the upstream device for handling object to be inspected, and when the determination unit determines the type of metal contained in the object to be inspected, the determination unit identifies the outflow source of the metal contained in the object to be inspected based on the correspondence between the predetermined type of metal and the upstream apparatus probable to discharge the metal of the type. In this way, the cause of the metal contained can be easily identified when it occurs. In addition, the statistics and history information will be useful maintenance information for the upstream apparatus.

(7) In the metal detection apparatus according to the present invention, the determination unit may have a first operation mode for detecting the metal contained into the object to be inspected and determining the type of the metal based on each fluctuation component detected by the detection circuit unit, and a second operation mode for at least setting the operating conditions or confirming the operating status of the detection circuit unit by using the metal sample, and the determination unit determines the type of metal contained in the object to be inspected in the first operation mode, and the type of the metal sample in the second operation mode. In this way, by switching the operation mode according to the purpose, it is possible to determine the type of metal contained in the object to be inspected and to determine the type of the metal sample used for setting the operation condition and confirming the operation state at the necessary timing respectively.

(8) In the metal detection apparatus according to the present invention, or described in paragraphs (1) to (7) above, may further comprise a type display unit displaying the metal contained in the object to be inspected in different color tones according to the different types of magnetism based on the determination result of the phase determination unit.

By this configuration, it is possible to determine the phase difference between the sample signal phase data of multiple types of metal samples and the sample signal phase data of the object to be inspected, which is greatly influenced by the metal contained in the object to be inspected, and based on the determination result, the metal contained in the object to be inspected is displayed in a different color tone for each type of magnetism. Therefore, it is possible to accurately and automatically determine whether the metal contained in the object to be inspected is a magnetic or non-magnetic metal and identify and display the determination result.

(9) In the metal detection apparatus according to the present invention, the type display unit executes a scale display in which plural phase areas resulting from mutual phase differences in the orthogonal coordinate system corresponding to the two detection phases are aligned in a predetermined direction and displayed in different color tones with respect to the plurality of metal samples, and a discriminatory display in which the phase of the metal currently being detected can be displayed identifiably on the scale display.

In this case, a scale display is made in different color tones for each type of metal sample with different magnetism, and the phase of the metal being detected is displayed identifiably on the scale display so that the presence or absence of magnetism of the metal and the type of metal can be clearly identified and displayed.

(10) In the metal detection apparatus according to the present invention, the type display unit may display the scale display in a bar-like scale shape extending in the predetermined direction.

By doing so, the presence or absence of magnetism of the metal and the type of metal can be more clearly identified and displayed.

(11) In the metal detection apparatus according to the present invention, the different types of magnetism include at least a magnetic metal type and a non-magnetic metal type.

By doing so, the presence or absence of magnetism of the metal can be more clearly identified and displayed.

Effect of the Invention

According to the present invention, a metal detection apparatus capable of automatically and accurately determining whether a metal passing through the inspection area is a magnetic metal or a non-magnetic metal can be provided, or a metal detection apparatus capable of accurately discriminating multiple types of metals with different degrees of non-magnetism and materials, even if they are non-magnetic metals. Furthermore, a metal detection apparatus can be provided that can automatically and accurately determine whether a metal passing through the inspection area is a magnetic or non-magnetic metal, and identify and display the type of metal.

DETAILED DESCRIPTION OF THE INVENTION

Hereinafter, the embodiment for implementing the present invention is explained with reference to the drawings.

(first embodiment of the present invention) FIGS. 1 to 10 show a schematic configuration of a metal detection apparatus according to the first embodiment of the present invention.

First, the configuration will be described.

Figure 1:
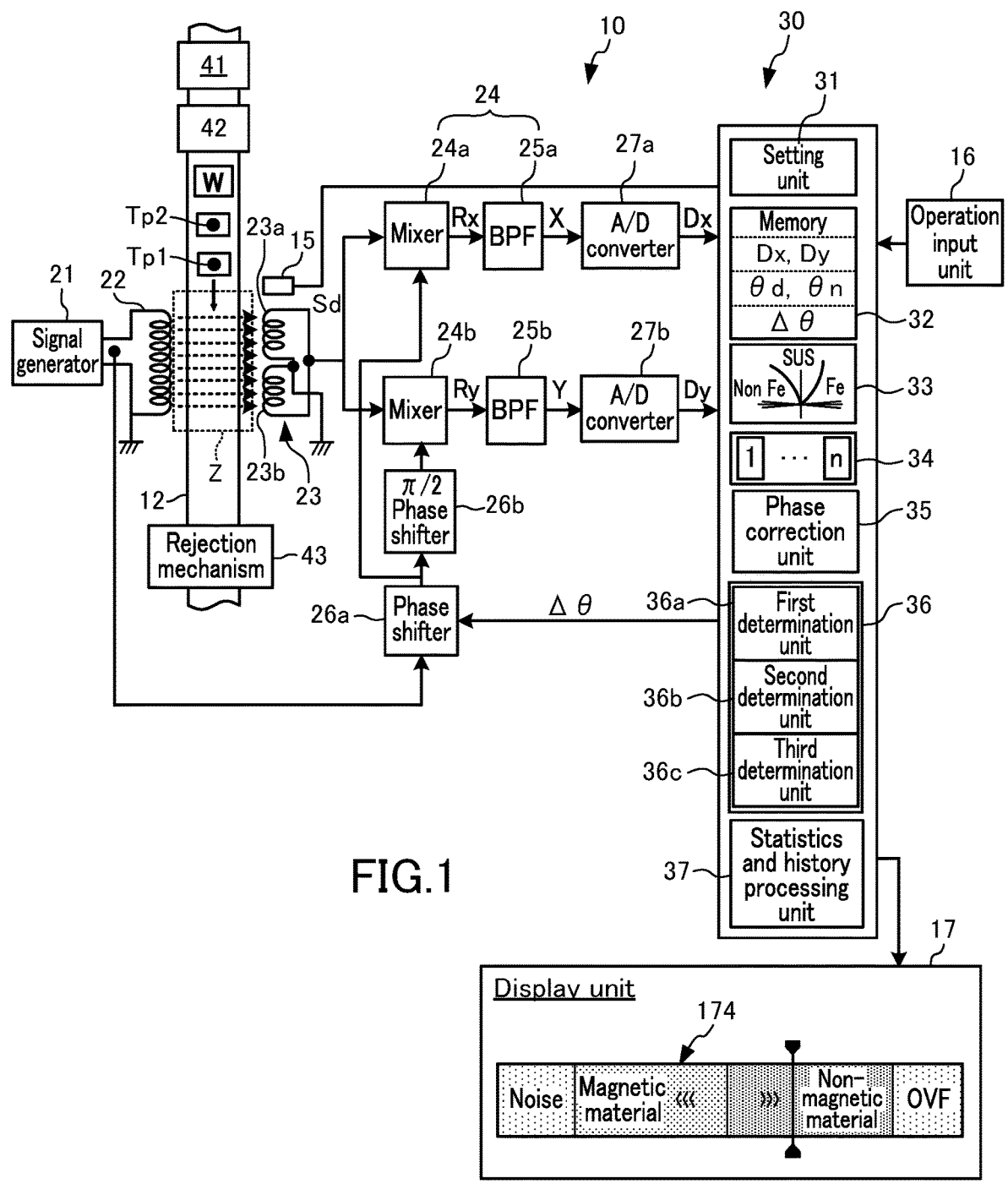
FIG. 1 is a schematic block configuration diagram of a metal detection apparatus according to the first embodiment of the present invention.
Figure 2:
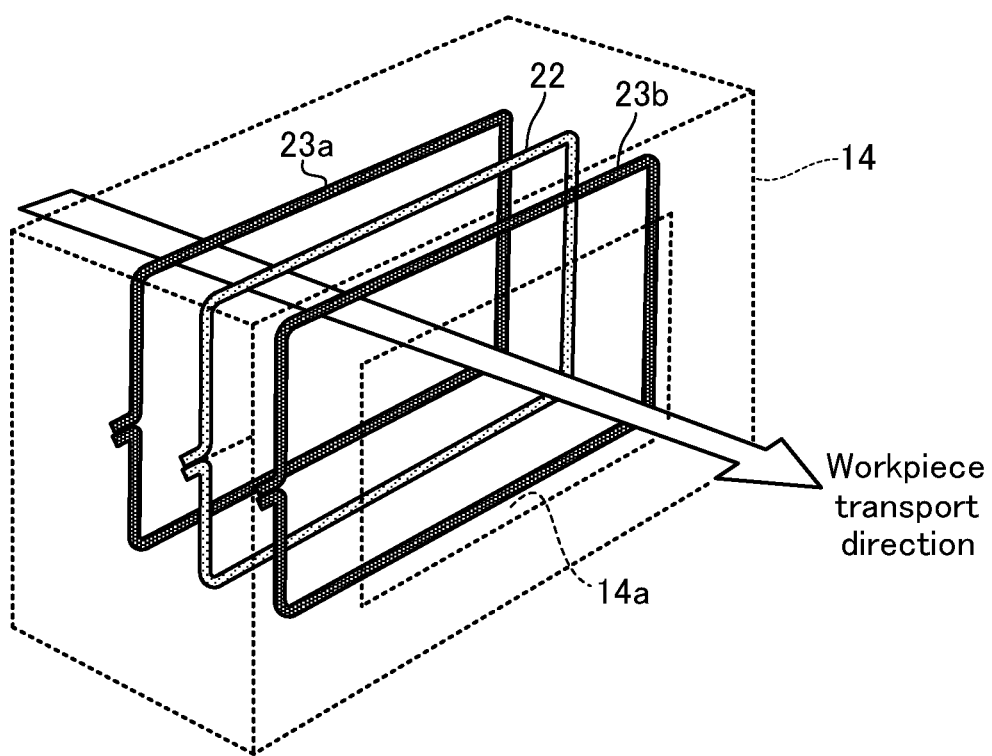
FIG. 2 is a schematic oblique view showing the configuration of the transmitter coil and the receiver coil in the detection head of the metal detection apparatus according to the first embodiment of the present invention.

As shown in FIGS. 1 and 2, the metal detection apparatus 10 of the present embodiment has a conveyor 12 that conveys a workpiece (inspection object) W, which is an object to be inspected, and an inspection head 14 located in the middle of the conveyor 12.

The workpiece W is, for example, a mass-produced food product wrapped with a packaging material, and can be a fixed-form product such as a boxed product, flexible-form product such as a flexible bag containing fluid, and the like, or a frozen product. Of course, the article that represents the workpiece W is not limited to food.

The conveyor 12 consists of a belt conveyor having a looped belt and rollers which are not shown, for example, so that a workpiece W can be conveyed in a predetermined direction through the aperture 14a in the inspection head 14.

The inspection head 14 can generate an alternating magnetic field in the inspection area Z corresponding to the workpiece W transport section of a predetermined length of conveyor 12, and can detect fluctuations in the magnetic field in the inspection area Z accompanying the passage of the workpiece W, and can detect metal (which can be either an unintentional foreign object or an expected part of a packaged product) or non-metallic foreign object (which can be an unintentional foreign object containing a metal or a metal component or, in the case of missing expected object detection, a component rather than a foreign object) in the workpiece W.

On the entrance side (upstream in the transport direction) of the inspection area Z, there is an optical article detection sensor 15, for example, which detects the entry of the workpiece W into the inspection area Z. In the upper front of the metal detection apparatus 10, an operation input unit 16 is provided for operation input by a user, and a display unit 17 is provided for displaying the operation input, displaying the operation status, notifying an abnormality, and the like.

Specifically, the metal detection apparatus 10 includes a signal generator 21 (reference signal generator) and a transmitting coil 22 (magnetic field generator) to generate an alternating magnetic field by the inspection head 14, receiving coil 23a on one side and receiving coil 23b on the other side to detect fluctuations in the alternating magnetic field by the inspection head 14, a detection unit 24 to process the detection signal of the inspection head 14 by quadrature detection processing, an A/D converters 27a, 27b to perform A/D conversion to the detection output signal from the detection unit 24, and a control unit 30 to execute a predetermined control program for metal detection based on the detection data after the A/D conversion.

The signal generator 21 generates an alternating current transmission signal of a predetermined frequency, and drives the transmitting coil 22 via an electric current amplifier which is not shown. In addition, the transmitting coil 22 is arranged in the vicinity of the conveyer path of the conveyor 12 and generates an AC magnetic field (alternating magnetic field) of a predetermined strength corresponding to the transmitting signal frequency in the inspection area Z when excited by the current drive from the signal generator 21. This transmitting coil 22, together with the signal generator 21, constitutes a magnetic field generator.

More specifically, as shown in FIG. 2, the transmitting coil 22 is arranged so as to surround the aperture 14a in the inspection head 14, and the receiving coils 23a, 23b are arranged so as to surround the aperture 14a of the inspection head 14 and to have approximately the same central axis in the front and back of the workpiece transport direction with respect to the transmitting coil 22.

The receiving coils 23a, 23b comprise at least a pair of coils arranged in such a way that the magnetic fluxes from the transmitting coil 22 cross in approximately equal amounts and are connected to each other in opposite phases. The receiving coils 23a, 23b are grounded at one end of the opposite side and connected to the detection unit 24 at the other end. These receiving coils 23a, 23b constitute a differential detector 23 (magnetic field detection unit) that works with the transmitting coil 22 to detect fluctuations of the magnetic field in the inspection area. The frequency of the AC magnetic field generated in the transmitting coil 22 is set variable by the control unit 30 described below, and the differential detector 23 is capable of detecting fluctuations in the AC magnetic field of each frequency set.

Specifically, when an AC magnetic field is generated in the inspection area Z, a voltage is induced in the receiving coils 23a, 23b, respectively, but the voltage output of the receiving coils 23a, 23b, which are connected in opposite phases to each other, equilibrates equally with respect to the AC magnetic field only from the transmitting coil 22, so that the difference in the induced voltage of the two receiving coils 23a, 23b (output as a differential detector 23) becomes zero. Therefore, for example, the other end of the receiving coils 23a, 23b is coupled via a variable resistor (not shown) for equilibrium adjustment, and is connected to the detection unit 24 from the midpoint of the variable resistor.

The magnetic metal passing through the magnetic field in the inspection area Z attracts more magnetic flux in proportion to the magnitude of the magnetic flux density, while the non-magnetic metal passing through the magnetic field generates eddy currents in a direction that counteracts the change in magnetic flux density caused by the movement, and consumes Joule heat.

Figure 3:
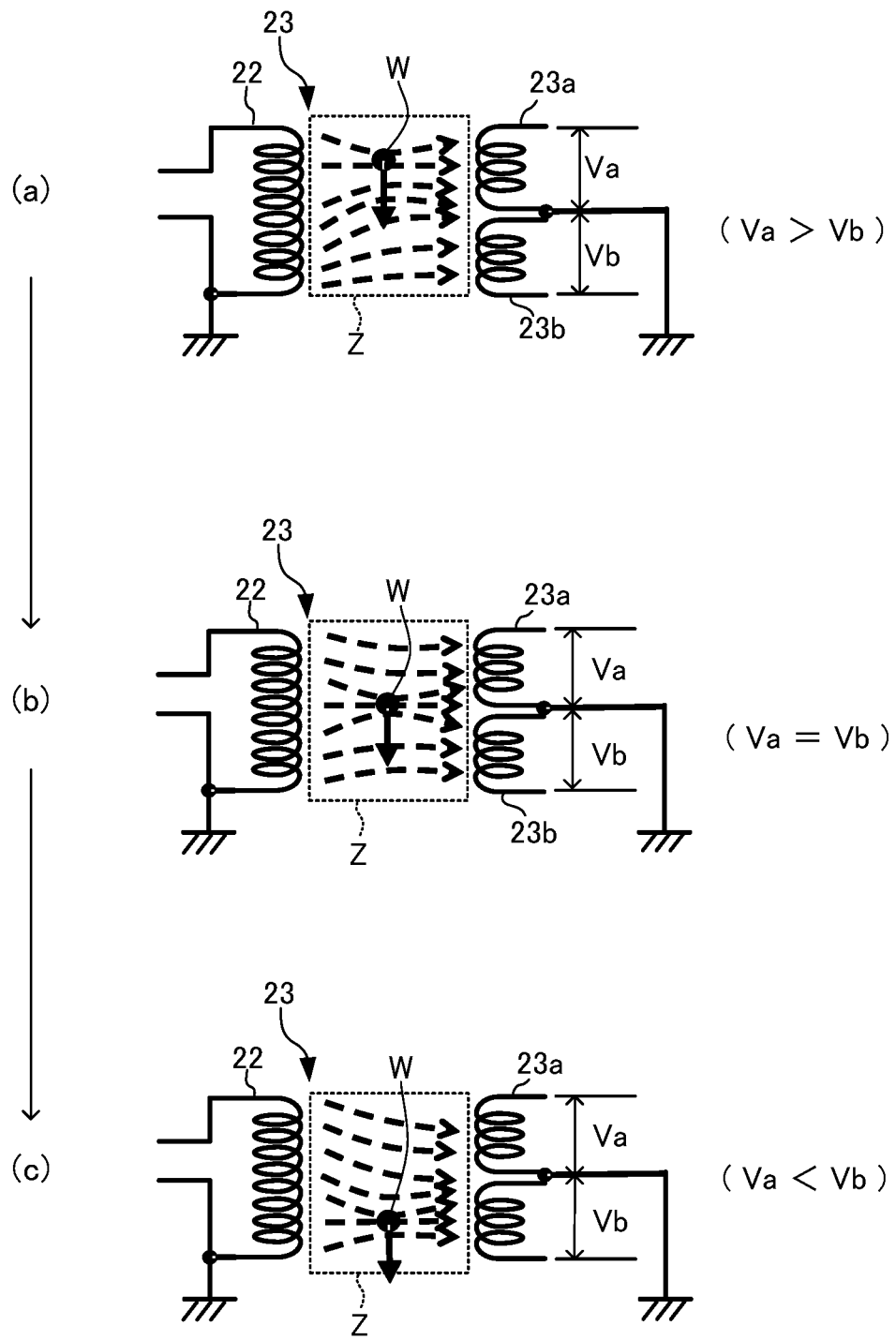
FIG. 3 is an explanatory diagram of the principle of the differential detection of magnetic field fluctuations at the time of metal passage in the metal detection apparatus according to the first embodiment of the present invention.

Therefore, when a magnetic metal contained with a product on the conveyor 12 passes through the generated magnetic field in the inspection area Z, for example, as shown in states (a) to (c) in FIG. 3, the large and small relationships of the induced voltages Va, Vb of the receiving coils 23a, 23b change according to the position of the metal that attracts the magnetic flux, and the equilibrium state of the output between the receiving coils 23a, 23b is disturbed. In addition, when only products that are almost non-magnetic pass through the generated magnetic field of the transmitting coil 22, the equilibrium state of the output between the receiving coils 23a, 23b is disturbed, although not as pronounced as it is when metals are included, by the influence of the components, moisture, packaging materials, and the like.

Figure 4:
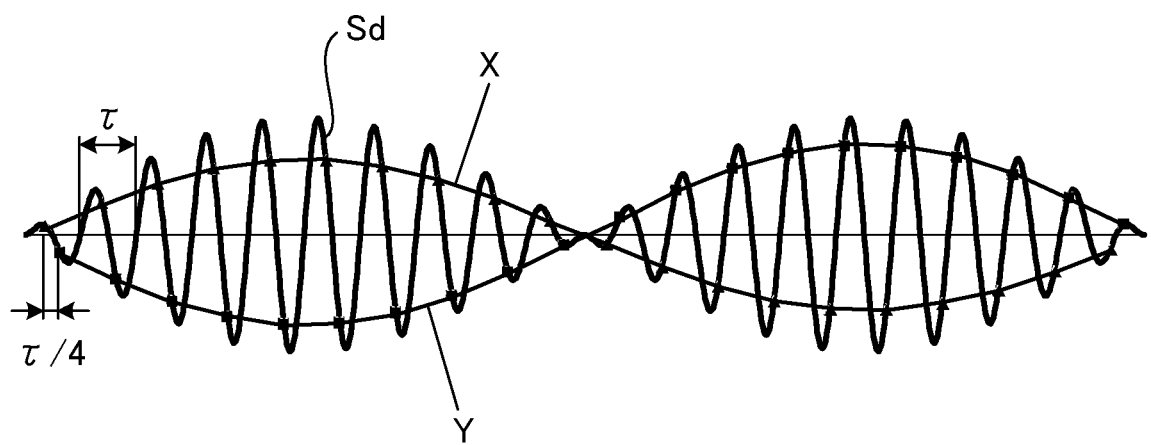
FIG. 4 is an explanatory diagram of quadrature detection of a differential detection signal in the metal detection apparatus according to the first embodiment of the present invention.

The receiving coils 23a, 23b output a differential detection signal Sd (magnetic field fluctuation signal) according to the change in the magnetic field when the equilibrium state of the output between the two receiving coils 23a, 23b is disturbed due to the movement of the product on the conveyor 12 in this way. This differential detection signal Sd is a modulated signal form in which a low-frequency signal component whose amplitude and phase change according to the movement of the workpiece W is superimposed on a high-frequency signal component having a frequency of the aforementioned transmission signal corresponding to the AC magnetic field from the transmitting coil 22 side, and can be expressed as a signal waveform as shown in FIG. 4, for example.

As shown in FIG. 1, the detection unit 24 constitutes a detection circuit unit comprising each pair of mixers 24a, 24b, band-pass filters 25a, 25b, and phase shifters 26a, 26b, and mixers 24a, 24b respectively receive differential detection signals Sd from differential detector 23.

The phase shifters 26a, 26b which shift the phase of the input signal by a set shift amount are respectively connected to the mixers 24a, 24b, and the phase shifter 26a shifts the phase of the above-mentioned transmission signal from the signal generator 21 by a predetermined shift amount which is set variable so as to increase the detection sensitivity, and supplies it to the mixer 24a. In addition, the phase shifter 26b generates a high-frequency signal that is 90 degrees different in phase from the high-frequency signal component of the differential detection signal Sd induced from the differential detector 23 by further shifting the phase of the signal generated by the phase shifter 26a by 90 degrees, and supplies it to the mixer 24b.

The mixer 24a synthesizes the high frequency signal from the phase shifter 26a and the differential detection signal Sd from the differential detector 23 and outputs it to the band-pass filter 25a. Similarly, the mixer 24b synthesizes the high-frequency signal from the phase shifter 26b and the differential detection signal Sd from the differential detector 23 and outputs it to the band-pass filter 25b.

The mixing of the inputs by the mixers 24a, 24b herein varies according to the amount of shifting, but based on the input signals from the phase shifters 26a, 26b, a detection signal of a first fluctuation component Rx that has a large influence of a non-magnetic metal that causes an external magnetic field change by consuming more Joule heat as the magnetic flux density change is large, at the moment when the magnetic flux density change is maximized (phase 0 degrees), and a detection signal of a second fluctuation component Ry that has a large influence of a magnetic metal that causes an external magnetic field change by attracting more magnetic flux as the magnetic flux density is large, at the moment when the magnetic flux density itself is almost maximized (the moment when the amplitude of the magnetic field waveform is maximized; phase 90 degrees) can be generated.

The band-pass filters 25a, 25b extract the detection signal of the low-frequency signal components that change according to the movement of the workpiece W among the two detection signals Rx, Ry synthesized by the mixers 24a, 24b, and have filter characteristics to remove the noise of the high-frequency components at the same time.

As shown in FIG. 4, the detection signals X, Y of the low-frequency component output from the band-pass filters 25a, 25b have a waveform of an envelope connecting an instantaneous value of a predetermined phase position in the waveform of the differential detection signal Sd and a waveform of an envelope connecting an instantaneous value that is out of phase from that predetermined phase position by ¼ period of the transmission signal cycle τ, that is, the instantaneous values that are out of phase by 90 degrees.

The detection signals X, Y output from both band-pass filters 25a, 25b are converted from analog signals to digital signals, detection data Dx, Dy, respectively, by the A/D converters 27a, 27b, and then incorporated into the control unit 30 as detection data Dx, Dy associated with the article detection signal from the article detection sensor 15.

The control unit 30 is a microcomputer structure including, for example, a CPU, a RAM, a ROM, and an I/O interface, and executes the control program stored in the ROM while exchanging data with the RAM, and processes various signals such as detection data Dx, Dy, and the like, obtained through the I/O interface. The control unit 30 may also have DSP (Digital Signal Processor) and FPGA (Field Programmable Gate Array), and the like, which perform digital signal processing.

By executing the above-mentioned control program, this control unit 30 can perform the functions of a setting unit 31, a first memory unit 32 for storing inspection data, a second memory unit 33 for phase determination, a third memory unit 34 for storing inspection conditions, a phase correction unit 35, and a determination unit 36, as shown in the functional block diagram in FIG. 1.

The setting unit 31 has a function to manually initialize various parameters necessary for the inspection in response to the instruction input from the operation input unit 16, and a function to semi-automatically initialize the parameters necessary for the inspection by passing a good sample of workpiece W or metal samples Tp1, Tp2 such as a test piece, and the like through the magnetic field (so-called auto setting mode). In addition, the setting unit 31 can switch between the normal metal detection mode and the setting/confirmation mode described later in response to the selection operation input to the operation input unit 16.

This setting unit 31 is a means of setting various setting parameters for the operation of the metal detection apparatus 10, such as the size (for example, length) and transport speed of the workpiece W of each type, the generation signal frequency of the signal generator 21, the phase correction amount AO by the phase shifter 26a, the pass band (frequency band) of the band-pass filters 25a, 25b, and the like, partly by manual input for each type of workpiece W and partly by automatic setting of other parameters.

The length and transport speed of the workpiece W are the conditions for determining the acquisition time and interval of the detection data Dx, Dy, the pass band of the band-pass filters 25a, 25b, and the like. Moreover, the signal frequency generated by the signal generator 21 is a parameter that can be selected according to the type and size of the metal to be detected and the material of the composition of the workpiece W (contents, packaging material, and the like), and the like. Furthermore, as is evident from the fact that the detection data Dx is identified by the instantaneous value of a predetermined phase position corresponding to the phase shift amount of the phase shifter 26a, the waveform amplitudes of the detection data Dx, Dy will differ according to the phase correction amount AO of the phase shifter 26a. In other words, the phase shifting amount of the phase shifter 26a is a parameter that determines the detection sensitivity of the metal contained in the workpiece W.

The phase correction unit 35 obtains the detection data Dx, Dy of a series of low frequency signal components taken in from the A/D converters 27a and 27b as a predetermined number of samples each time the workpiece W to be inspected passes through the inspection area Z. Based on the obtained signal data, the Lissajous figure can be created as a scatter diagram in which the values of the detection data Dx, Dy are the orthogonal coordinate components on the X-Y plane in which the horizontal axis is on the phase 0° (in-phase) side and the vertical axis is on the phase 90° (quadrature phase) side at the time of detection, as shown in FIG. 5.

Figure 5:
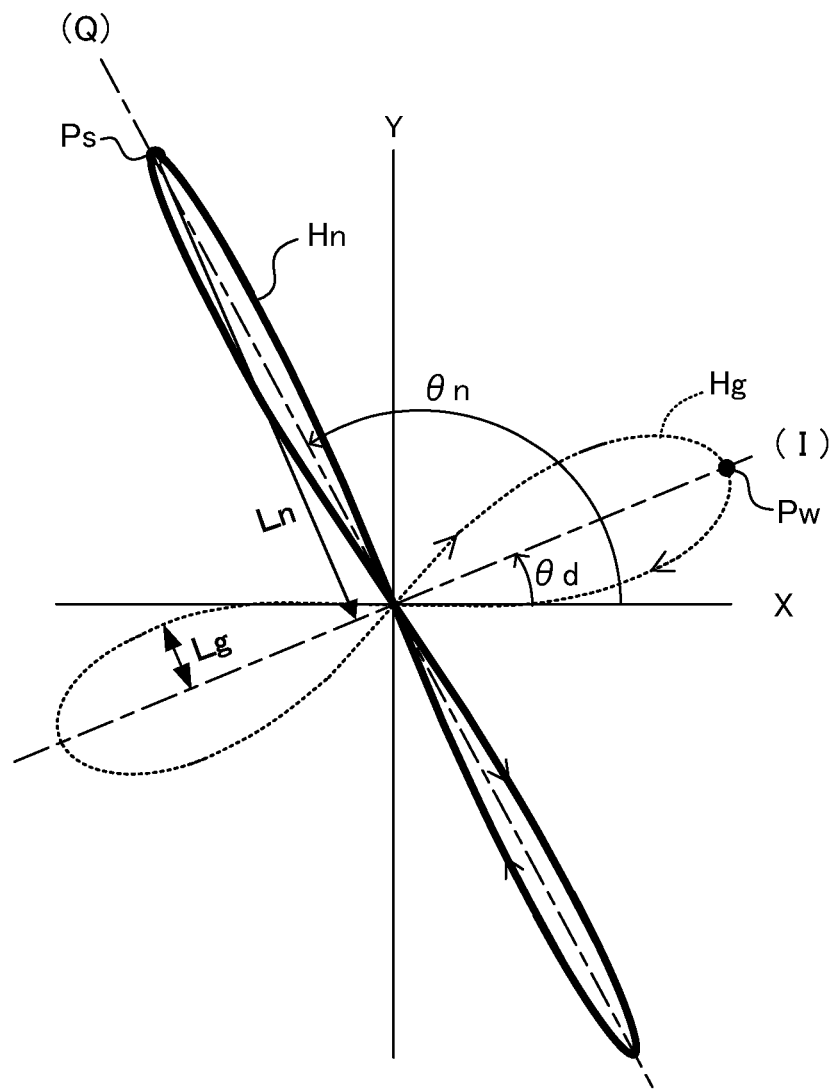
FIG. 5 is a graph showing the distribution form on the orthogonal coordinate plane of the quadrature detection signal data in the metal detection apparatus according to the first embodiment of the present invention in the Lissajous figure, wherein the horizontal axis is the signal component level in the same phase as the reference signal and the vertical axis is the signal component level in the phase orthogonal to the reference signal.

The phase correction unit 35 makes the phase Od at the center where the detection data of the magnetic field fluctuation component due to the product influence of the workpiece W is distributed in the Lissajous figure shown in FIG. 5 a reference phase, calculates the phase correction amount AO that can correct the phase difference of the reference phase relative to the phase at the time of detection by the detection unit 24 (corresponding to the difference of the slope angle of the regression line in the scattered diagram), and can correct the detection phase.

Figure 6:
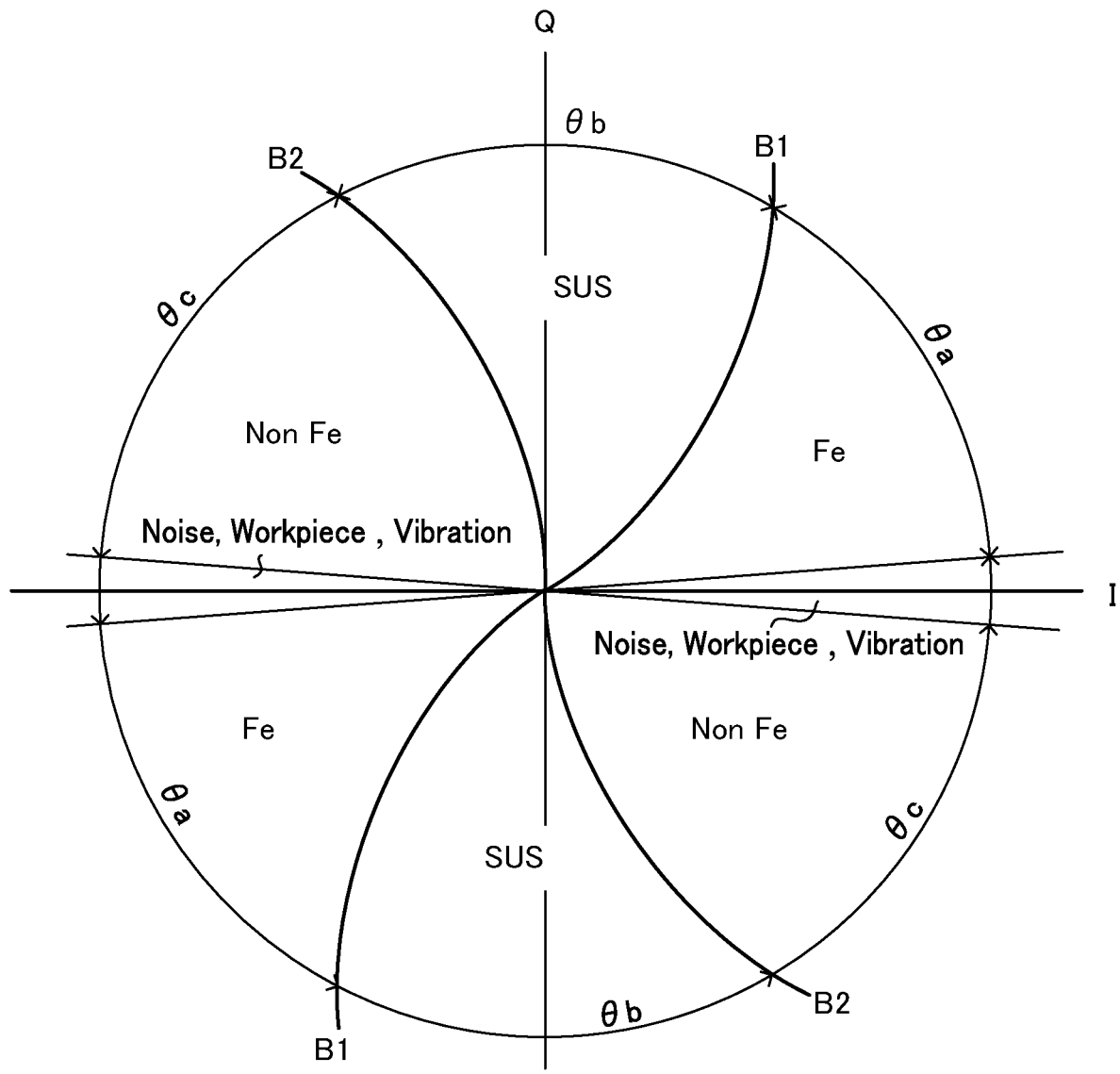
FIG. 6 is a schematic diagram of a determination map that illustrates a determination condition for determining the type of metal contamination based on the distribution of quadrature detection signal data on the orthogonal coordinate plane in the metal detection apparatus according to the first embodiment of the present invention.

In this case, if the workpiece W contains metal (metal foreign object or metal components in the product), as shown in FIGS. 5 and 6, on the I-Q plane with the reference phase I, which is regarded as the in-phase side relative to the phase at the time of detection, defined as the horizontal axis, and its orthogonal phase (quadrature) defined as the vertical axis Q, the detection data Dx, Dy (hereinafter referred to as the product influence signal) when only the workpiece W (good product) passes through the magnetic field are distributed in the vicinity of the reference phase I, and the detection data Dx, Dy (hereinafter referred to as the metal influence signal) when the metal passes through are distributed in the quadrature phase Q side. The in-phase side and the quadrature phase side in the present invention are relative phase relationships of two detection signals X, Y. As shown in FIG. 4, when the detection signals X, Y are enveloped lines connecting a specific phase position on the phase delayed side (right side in the same figure) to the starting point of phase 0 of the magnetic field fluctuation component, it means that the phase difference of the detection signal Y is greater than that of the detection signal X with respect to the starting point. In addition, the amount of change in the magnetic flux density of the AC magnetic field becomes large on the low amplitude side close to the phase 0° or 180° of the AC magnetic field corresponding to the reference signal, and on the high amplitude side close to the phase 90° or 270°, the magnetic flux density of the AC magnetic field becomes large.

The phase correction unit 35 is designed to set the sensitivity so that the amplitude level in the quadrature phase Q, which is the determination phase for the presence or absence of a metal, becomes the minimum level in the in-phase I side where the product influence is large, and the amplitude level appears large in the quadrature phase Q side where the metal influence is large.

The determination unit 36 has a first determination unit 36a (means for determining whether there is a metal presence or absence in the workpiece W), which compares the amplitudes Lg, Ln of the product influence and the metal influence detection data in the metal presence determination phase (quadrature phase Q) on the above-mentioned I-Q plane, and executes the determination process for determining whether there is a metal presence or absence in the workpiece W according to whether the ratio of the amplitude (Ln/Lg) exceeds a predetermined limit value or not.

By the way, in FIG. 5, the shape of the scatter diagram of the metal influence signal (Lissajous figure Hn) is relatively thin in relation to the shape of the scatter diagram of the product influence signal (Lissajous figure Hg) of the workpiece W, and its detection phase (θn in the same diagram) is approximately quadrature to the detection phase of the product influence signal (θd in the same diagram), but the scatter diagram shape (shape of the Lissajous figure) of the influence signal such as the metal entering the workpiece W and its test piece changes according to the material and size of the metal or the test piece, and the slope of the figure changes according to the aforementioned predetermined phase position (aforementioned phase correction amount AO) that takes the envelope line X from the differential detection signal Sd.

The Lissajous figure Hn of the metal influence signal shown in FIG. 5 schematically illustrates the case where the material is a non-magnetic metal. The phase angle tends to change and the amplitude changes according to the size (for example, diameter) of the metal, depending on the difference in the amount of ferrite of stainless steel (martensitic, ferritic, austenitic, and the like), other types of metal (for example, aluminum (Al), brass (Brass), and the like), or non-metallic or metal-containing composite materials.

Therefore, in the present embodiment, the first determination unit 36a of the control unit 30 executes the sensitivity-priority processing to calculate the phase θd, θn in which the ratio of the amplitude of the magnetic field fluctuation component due to the metal influence (Ln/Lg in FIG. 5) is the maximum in relation to the product influence at the first determination unit 36a, while the second determination unit 36b and the third determination unit 36c execute the processing for determining the type of the metal separately from the processing for sensitivity-priority.

FIG. 6 shows an explanation of a determination map (type determination condition) in which the results of calculating the detection phase angle θn of the peak Ps of the Lissajous figure Hn of the metal influence signal are plotted on the I-Q plane with respect to the type and size of a plurality of metals (objects to be detected). In the I-Q plane, the reference phase I, which is phase-adjusted to be within the range of the fluctuation level of the detection signal due to noise and vibration, is the horizontal axis, and the orthogonal phase axis Q, which is orthogonal to it, is the vertical axis. The determination map divides a plurality of types whose detection phase angle θn is different from each other by the distribution range of their phase angles.

In FIG. 6, "Fe" illustrates the distribution range when the metal is made of iron or other magnetic metals, and the boundary line B1 curved to the side of increasing phase angle according to the type and size (diameter Φ) of the magnetic metal is the upper limit of the phase angle of the metal of the type group, for example, the larger the diameter of the metal so as to be away from the center of the I-Q plane, the larger the phase angle becomes.

In FIG. 6, "SUS" can contribute to the determination of metals made of, for example, ferritic stainless steel near the boundary line B1, austenitic stainless steel near the boundary line B2, and many other stainless steels (such as martensitic). In this case, the larger the metal diameter becomes so as to be away from the center of the I-Q plane, the larger the phase angle becomes, and the boundary line B2 is also curved to the side of increasing phase angle. In other words, the boundary line B2 shows a tendency that the detection phase of the adjacent type group is not proportional to the size of the metal (diameter 1), as in the case of the boundary line B1.

In FIG. 6, Non-Fe is shown as an example of the range of distribution in the case of other types of metals such as aluminum, brass and other non-ferrous metals, special metals with high corrosion resistance, composite materials, and the like. The phase angle of Non-Fe is different depending on the type or size (diameter 1) of the metal, and the range of the fluctuation level of the detection signal due to noise and vibration near the phase angle that is reversed (180° different from the reference phase I) is the upper limit of the phase angle of the metal of the type group.

Thereafter, when the predetermined phase position when taking out the detection signals X, Y from the differential detection signal Sd becomes higher phase angle side, the distribution of each type group is similarly divided in the order of Fe, SUS, and Non-Fe across the boundary lines B1, B2.

In the second memory unit 33 for phase determination, the type determination map shown in FIG. 6 is stored as the type determination condition data, and the second determination unit 36b of the determination unit 36 determines, based on the type determination condition data, whether the detection phase angle θn of the peak Ps of the Lissajous figure Hn of the metal influence signal is in the distribution area Fe, SUS, or Non-Fe of each of the plural type groups in FIG. 6. The type determination condition data stored in the second memory unit 33 and used in the second determination unit 36b is the sample signal phase data obtained in advance by using the magnetic field fluctuation signal detected when each metal sample of various types passes respectively through the inspection head 14.

The second determination unit 36b of the determination unit 36 determines the phase θn of the Lissajous figure Hn of the metal influence signal of the low frequency component in the orthogonal coordinate system (X-Y coordinate system) corresponding to the quadrature detection phase due to the fluctuation of the AC magnetic field in the inspection area Z caused by the passage of the various metal samples Tp1, Tp2, and the like, out of test pieces of multiple metals and other metal samples. Moreover, the second determination unit 36b is a phase determination means that determines the phase of the workpiece W and the phase of the metal contained into the workpiece W by comparing the phase data (signal phase data of the object to be inspected) obtained based on the magnetic field fluctuation signal detected when the workpiece W in which the metal is contained passes through the inspection head 14 with the sample signal phase data described above and determining the difference between the two data.

The third determination unit 36c of the determination unit 36 is capable of determining whether one of magnetic metals such as iron (denoted as Fe in FIG. 6), one of non-magnetic metals such as stainless steel (denoted as SUS in FIG. 6), or one of aluminum, brass, or other types of metals (denoted as Non-Fe in FIG. 6) is detected based on the distribution area of the detection phase angle θn of the metal influence signal determined for each metal sample by the second determination unit 36b, and outputs the result to the display unit 17 along with the determination type. The third determination unit 36c is a metal type determination means determining the type of the metal that passes through the inspection area Z based on the determination result of the second determination unit 36b, which is a metal type determination means.

FIG. 6 shows that the distribution of the metal detection phase angle θn of each type group tends to become larger the further away from the center point of the I-Q orthogonal coordinate plane within the range of the distribution angles θa, θb, and θc of each type group. However, the conditions for determining the type are not limited to those shown in FIG. 6. If the material of metal to be assumed from the equipment configuration of the production line, and the like, is identified and the detection characteristics are stored in advance, it may be possible to determine whether the material belongs to any of them by setting a plurality of independent distribution areas specified in the distribution range of a specific type, instead of dividing the distribution range by a boundary line.

Figure 7:
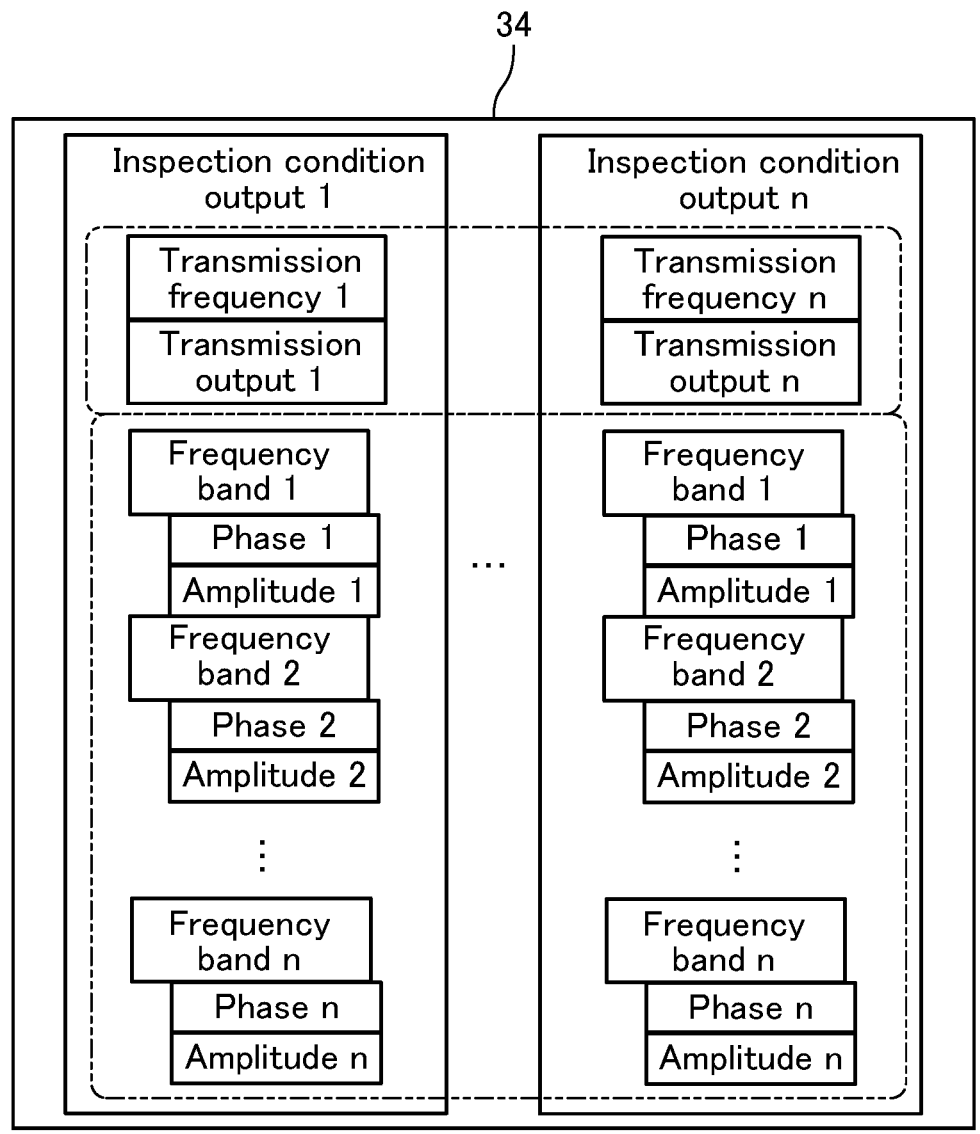
FIG. 7 is an explanatory diagram of the memory for storing readable metal type determination conditions for each inspection condition in the control unit of the metal detection apparatus according to the first embodiment of the present invention.

FIG. 7 is a functional explanation of the third memory unit 34 for storing inspection conditions that stores the inspection conditions and the transmission output level under the inspection conditions for determining each metal type as shown in FIG. 6 on the assumption that each type of metal is contained into each workpiece W.

As shown in FIG. 7, the data with the frequency band, phase, and amplitude set for each transmission frequency and transmission output from the predetermined transmission frequency 1 and transmission output (level) 1 to the transmission frequency n and transmission output n with at least one of the values sequentially changed, which are the frequency band, phase, and amplitude of the pass band when the magnetic field fluctuation signal Sd in the inspection area Z accompanying the transport and passage of the workpiece W is detected by the detection unit 24 and processed by the bandpass filter, is stored in the third memory unit 34. The frequency band, phase and amplitude are set from the frequency band 1, phase 1 and amplitude 1 to the frequency band n, phase n and amplitude n. The data set in this manner is obtained for each type in advance from the magnetic field fluctuation signals detected at the time of passing through the inspection head 14 by passing through various types of metal samples out of multiple types of metal samples for each transmission frequency and transmission output, and includes the sample signal phase data and sample signal amplitude data referred to in the present invention.

The respective transmission conditions for each of these transmission frequency 1 and transmission output 1 to transmission frequency n and transmission output n, and the stepwise setting of frequency bands, phases, and amplitudes when filtering the detection signals Rx, Ry, are effective, for example, for preparing multiple metal samples of the same type with different sizes for each type of metal sample of multiple types, and setting suitable inspection conditions for each.

The third determination unit 36c of the determination unit 36 can determine the amplitude of the metal influence signal in addition to the type of metal passing through the inspection area Z for each type of metal sample of the same type with different sizes, based on the inspection conditions stored in the third memory unit 34. Accordingly, the third determination unit 36c, in cooperation with the third memory unit 34, can function as an amplitude determination means for determining the amplitude of the metal influence signal for a plurality of metal samples of the same type having different sizes for each type of metal sample.

Thus, the metal detection apparatus 10 of the present embodiment is equipped with a signal generator 21 and a transmitting coil 22 as a magnetic field generator that generates an alternating magnetic field based on a reference signal in the inspection area Z through which the workpiece W passes, a differential detector 23 that detects the fluctuation of the alternating magnetic field in the inspection area Z due to the passage of the workpiece W and outputs a magnetic field fluctuation signal Sd, a detection unit 24 that executes the process of detecting the detection signal X of the first fluctuation component on the in-phase side of the reference signal and the detection signal Y of the second fluctuation component on the quadrature phase side of the reference signal in two detection phases that are quadrature to each other among the magnetic field fluctuation signals Sd, and a determination unit 36 that has a first determination unit 36a that executes the metal presence or absence determination process to detect the metal mixed in the workpiece W based on the detection signals X, Y from the detection unit 24.

Furthermore, the determination unit 36 has a second determination unit 36b as a phase determination means to determine the difference by comparing the phase θn of the detection data of the metal influence generated in the orthogonal coordinate system corresponding to the quadrature detection phase with the sample signal phase data of each type when the AC magnetic field in the inspection area Z fluctuates due to the passage of the workpiece W containing the metal or various metal samples among multiple types of metal samples, and a third determination unit 36c as a metal type determination means determining the type of the metal that passes through the inspection area Z based on the determination result, separately from the first determination unit 36a to detect metal contained in the workpiece W with high sensitivity.

Moreover, the third determination unit 36c of the determination unit 36 has the function of an amplitude determination means to determine the difference in the amplitude of the metal influence signal for the plurality of metal samples of the same type with different sizes for each type of metal sample, and to determine the type and size of the metal passing through the inspection area Z based on the amplitude determination result.

In addition, the third determination unit 36c, which is a metal type determination means, determines which type of metal sample approximates and differs from the other, and which size of metal sample approximates and differs from the other, based on data including not only phase θn but also amplitude of the metal influence signal generated in the orthogonal coordinate system, based on the information of the boundary lines B1, B2 of the distribution area of the plural type groups (Fe, SUS, Non-Fe) in the orthogonal coordinate system respectively.

Then, the second determination unit 36b of the determination unit 36 stores the determination conditions (e.g., the determination map shown in FIG. 6 or the calculation formulas of boundary lines B1, B2, and the like for determination) as sample signal phase data and sample signal amplitude data, and the like, for each frequency band set for the frequency of the reference signal or the detection signal of the differential detector 23, in the second memory unit 33 and the third memory unit 34 for determining the phase θn of the metal influence signal generated in the orthogonal coordinate system when various metal samples pass through the inspection area Z. The second determination unit 36b determines the type of metal that passes through the inspection area Z based on the determination conditions.

In the metal detection apparatus 10 of the present embodiment, the control unit 30 also includes a statistics and history processing unit 37 that can record the type information corresponding to the history information in association with the statistics of the inspection results of the workpiece W passing through the inspection area Z and the history of the inspection and metal detection results using a known method by accumulating the determination results of the determination unit 36.

In addition, the inspection area Z is arranged downstream in the article transport direction for multiple types of upstream apparatuses 41, 42 (for example, apparatus for product loading, sealing, and packaging) that handle the workpiece W. When determining the type of metal mixed in the workpiece W, the determination unit 36 also processes to determine any of the upstream apparatus 41 or 42 (outflow sources) out of the multiple types of apparatus that can outflow the metal of the determination type.

Next, the operation of the above-mentioned metal detection apparatus 10 and its function are explained.

(During Setup and Operation Check)

At the time of setting and checking the operation of the metal detection apparatus 10, the user presses the menu key of the operation input unit 16 to display a menu screen (not shown in detail) having selection items such as an automatic setting, a change in detection sensitivity (level), an article effect display, a statistical menu, and the like. First, for example, the automatic setting is selected, and before actually detecting the metal, a test inspection and measurement (hereinafter referred to as a sample inspection) is performed to pass a good sample of the workpiece W or a metal samples Tp1, Tp2 of foreign object such as, and the like through the inspection head 14, so that the initial settings necessary for the operation of each part of the metal detection apparatus 10 are made. The sample inspection is performed not only when the product to be inspected is registered, but also when the operation based on the registration information is confirmed. Such a sample inspection may use a test fluctuation component equivalent to the test piece influence signal described, for example, in Japanese Patent Application Laid-Open No. 2018-200197, in part or in whole.

Figure 8:
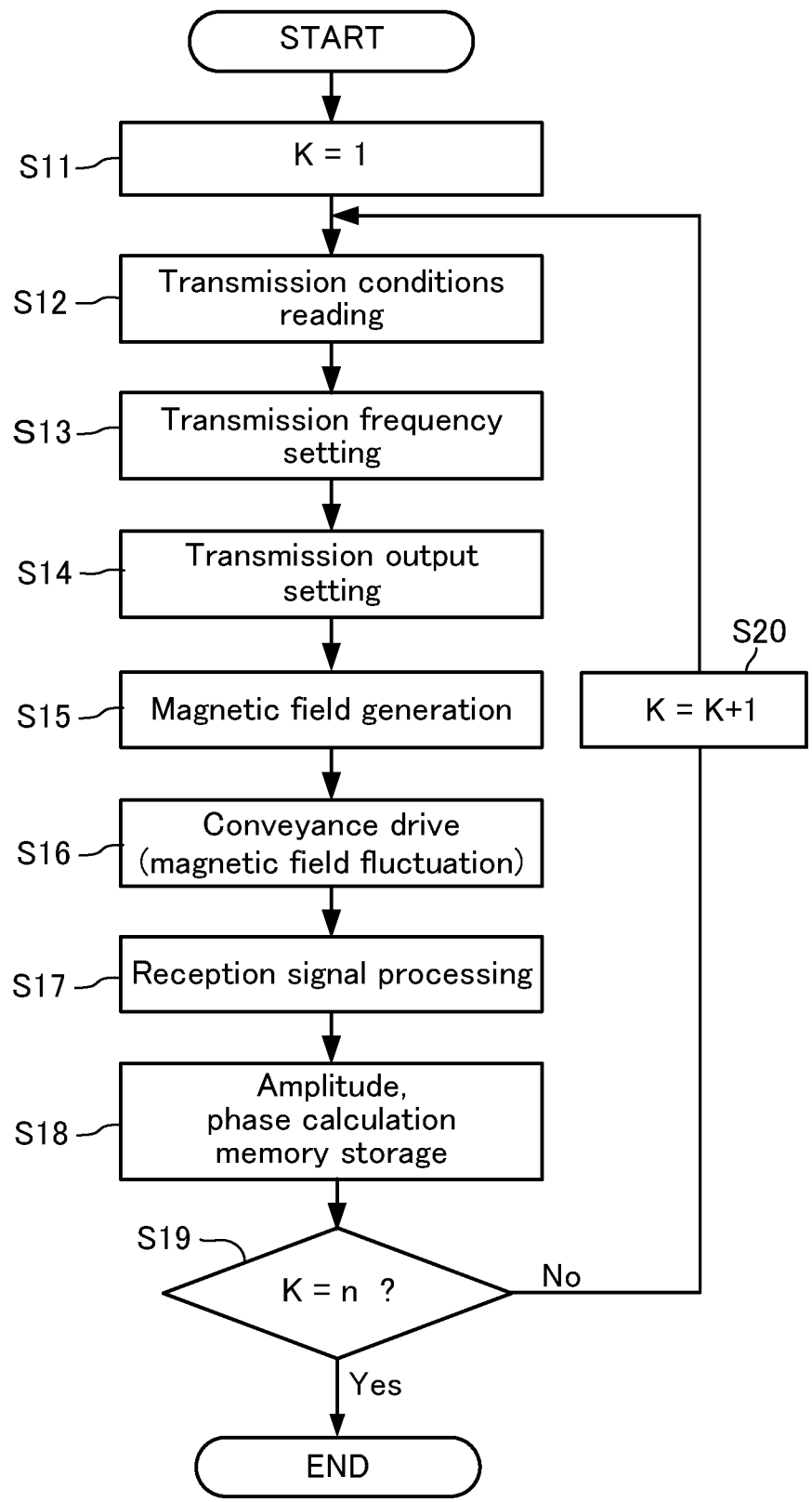
FIG. 8 is a flowchart showing a procedure for storing the metal type determination conditions for each inspection condition in the memory of the control unit of the metal detection apparatus according to the first embodiment of the present invention.

As shown in FIGS. 7 and 8, when setting the "frequency band, phase, and amplitude" information for each of the transmission conditions (transmission frequency and transmission output) 1 to n to be stored in the third memory unit 34 for storing the inspection conditions, first of all, the transmission conditions are read (steps S11, S12) for the first inspection condition and output 1, and then the transmission frequency and transmission output are set (steps S13, S14) in order to carry out a test inspection with the corresponding test piece of one type or another.

Next, an alternating magnetic field is generated in the inspection area Z of the metal detection apparatus 10 (step S15), the workpiece W is conveyed so that it passes through the inspection area Z (step S16), and the signal processing system from the detection unit 24 to the control unit 30 executes reception signal processing based on the magnetic field fluctuation signal Sd output from the differential detector 23 (step S17). Then, the amplitude Ln and phase θn of the magnetic field fluctuation component are calculated from the Lissajous figure Hn of the metal influence signal in the orthogonal coordinate system and stored in the third memory unit 34 for storing the inspection conditions (step S18).

Next, it is determined whether or not the transmission condition (transmission frequency and transmission output level) n has been reached (k=n) or not (step S19), and according to the determination result, the transmission condition numbers are sequentially added (step S20), and the test inspection and measurement involving a series of processing steps S11 to S19 are repeated until the transmission condition n is reached, and the work of setting the information stored in the third memory unit 34 for storing the inspection conditions is executed.

During such a setting operation, the control unit 30 determines the status of the type registration successively, and if the automatic setting has not yet been completed, for example, an incomplete setting symbol is displayed as an operation mode indication symbol, and when the type registration is completed, a different mode indication symbol is changed to a different mode indication symbol to encourage the required setting operation.

In this embodiment, when the metal samples to be used are metal samples Tp1, Tp2, and the like of a plurality of types, such as a test piece of ferrous (Fe) which is a magnetic metal, a test piece of stainless steel (SUS) which is a non-magnetic metal, and a test piece of non-ferrous (Non-Fe), and the like, the inspection conditions can be set using those test pieces in an arbitrary order.

Moreover, when a sample inspection using a predetermined plurality of test pieces is required in the operation confirmation of the metal detection apparatus 10, the determination unit 36 can determine the type of each metal sample with respect to the plurality of metal types used for the sample inspection, so that the operation confirmation work can be prevented from omissions or mistakes such as only passing a metal sample of the same type, for example, a metal sample of a magnetic metal, through the inspection head 14 and terminating the operation confirmation work without performing the sample inspection using a different type of metal sample such as a non-magnetic metal.

Furthermore, in the case that the auto setting is predetermined, for example, a test piece of a magnetic metal out of a plurality of test pieces is used first to set the coarse detection condition, and then a test piece of a non-magnetic metal is used to set the detection condition to ensure that a metal can be detected regardless of whether it is magnetic or not, even if the procedure is performed in a wrong way, the control unit 30 can set the appropriate detection condition based on the inspection data for each type.

(Setting/Confirmation Mode)

The metal detection apparatus 10 has two modes: a normal operation mode (metal detecting mode, first operation mode) to inspect whether or not the object to be inspected received from the upstream apparatuses 41, 42 is contained with metal as a foreign object, and another mode (setting/confirmation mode, second operation mode) to set the necessary settings for the operation of each part of the metal detection apparatus 10 using a good sample of workpiece W or a predetermined metal sample, and to confirm whether or not a metal sample of a predetermined type as a control standard is detected correctly. In the metal detection apparatus 10, the control unit 30 switches between the two modes upon operation of the operation input unit 16 by an operator.

In this embodiment, in addition to the metal detecting mode for detecting metals contained in the object to be inspected, in the setting/confirmation mode for setting conditions and confirming operation by combining a good sample and various metal samples, it is possible to determine the type of metals passing through the inspection area by appropriately combining sample signal phase data and sample signal amplitude data stored in advance, and to check whether the metal sample used for setting conditions and confirming operation is of the correct type.

(Normal Operation Mode)

During normal operation of the metal detection apparatus 10, although details are not shown, the operation screen is displayed on the display unit 17. At the time of normal operation, for example, the product number, the product name, characters such as OK (good/passed)/NG (defective/failed), and the like, which are the determination results, the total number of workpiece W inspected, the number of NG items counted, and characters to the effect that the metal detection apparatus 10 is in operation or stopped, and the like, are displayed, and when mixing of metal into workpiece W is detected, along with the NG character, an indication that allows the type of metal detected to be determined, for example, whether it is magnetic or not, such as, for example, Fe, SUS, or Non-Fe, and the like, is output.

Figure 9:
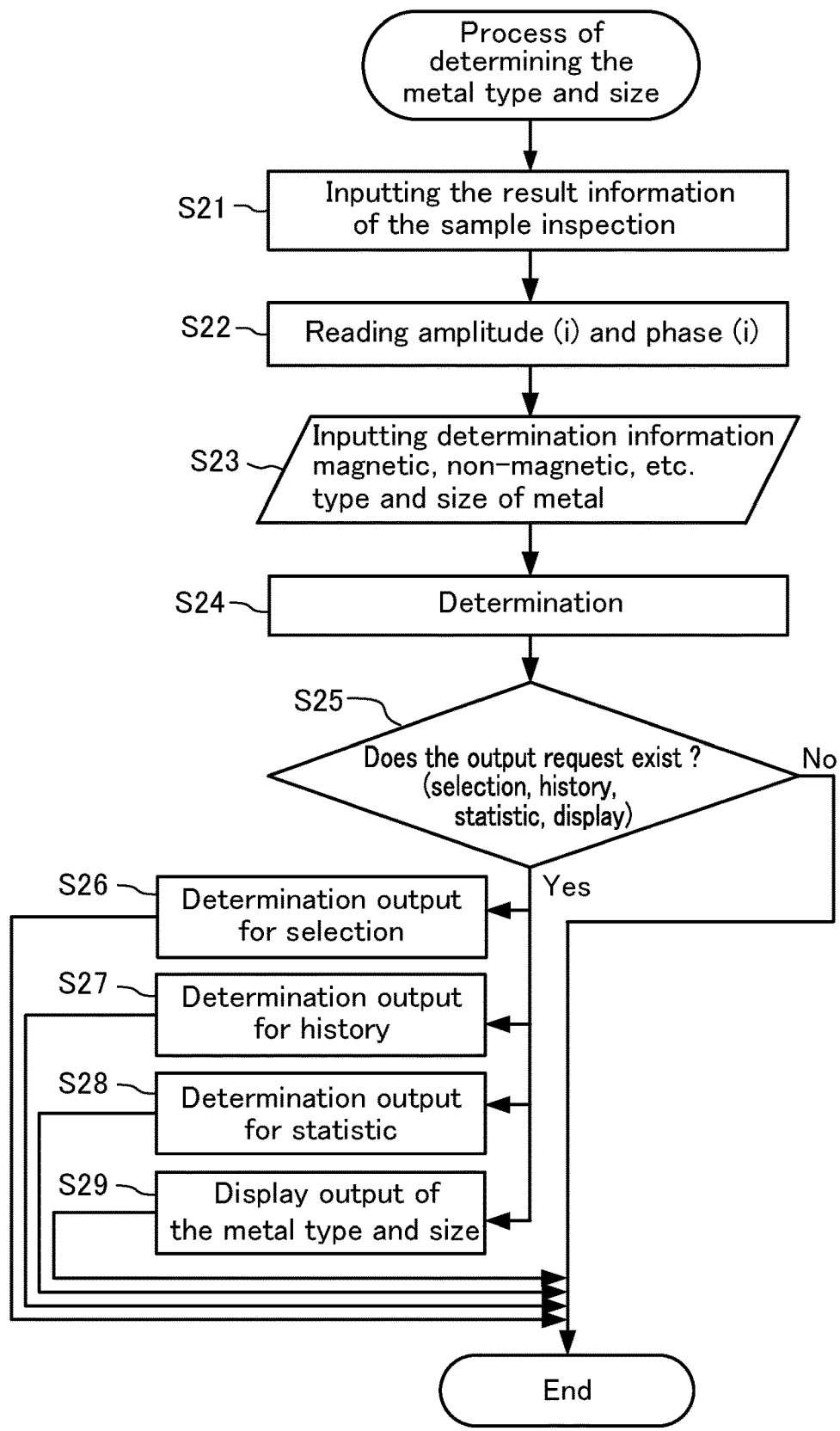
FIG. 9 is a flowchart showing an outline procedure of the processing to determine the type of the metal sample at the time of the sample inspection in the metal detection apparatus according to the first embodiment of the present invention.

The process of determining the metal type and size is performed by the processing procedure shown in FIG. 9.

First, after reading and inputting the result information of the sample inspection using multiple types of test pieces from the third memory unit 34 for storing inspection conditions (step S21), the amplitude (i) (from amplitude 1 to amplitude n) and phase (i) (from phase 1 to phase n) corresponding to each inspection condition are read (step S22).

Next, information to determine the type and size of metals such as magnetic, non-magnetic and other metals i.e., the data of a map (type determination condition) that can determine the distribution of the detection phase angle θn of two or more metal type groups or the formula for calculating multiple boundary lines B1, B2, is read and input from the second memory unit 33 for phase determination (step S23). Based on the input information, it is determined which type of distribution range the detected phase angle θn of the peak Ps of the Lissajous figure Hn of the metal influence signal belongs to, and which size amplitude area the amplitude Ls of the peak Ps is located in. Then, the inspection data is stored in the first memory unit 32 for storing inspection data and the statistics and history processing unit 37 (step S24).

Next, it is checked whether or not there is a rejection command request to the rejection mechanism 43, an inspection history display request, an inspection result statistical display request, or a display output request of the type and size of the detected metal (step S25). After the output process (steps S26, S27, S28, S29) is executed, the process this time is ended.

Thus, in the present embodiment, the detection signal X, which is the first fluctuation component of the magnetic field fluctuation signal, is detected by the detection unit 24 on the in-phase side of the reference signal, and the detection signal Y, which is the second fluctuation component of the magnetic field fluctuation signal, is detected on the quadrature phase side of the reference signal, respectively, and the first determination unit 36a of the determination unit 36 executes the metal presence determination process for detecting the metal mixed in the workpiece W based on the detection data Dx, Dy of the detection signals X, Y of both fluctuation components.

In addition, at the second determination unit 36b and the third determination unit 36c of the determination unit 36, the phase angle θn of the peak Ps of the Lissajous figure Hn is determined for the metal influence signal generated in the orthogonal coordinate system corresponding to the quadrature detection processing in accordance with the fluctuation of the AC magnetic field in the inspection area Z caused by the passage of various metal samples. The type of metal passing through the inspection area Z is determined based on the result of the difference determination by comparison with the sample signal phase data and the like stored for each type. Therefore, it is possible to accurately and automatically determine whether the metal passing through the inspection area Z is a magnetic metal (Fe) or a non-magnetic metal (SUS). In addition, it is possible to accurately distinguish multiple types of metals (SUS or Non-Fe) with different degrees of non-magnetism and materials, even if they are non-magnetic.

Furthermore, in this embodiment, the third determination unit 36c of the determination unit 36 has the function of an amplitude determination means to determine the difference (large and small) in the amplitude Ln of the Lissajous figure Hn of the metal influence signal generated in the orthogonal coordinate system when passing through the inspection area Z for the plurality of metal samples of the same type having different sizes. Therefore, based on the determination result of the amplitude determination means, it is possible to determine not only the type of metal passing through the inspection area Z, but also its size.

In addition, the third determination unit 36c of the determination unit 36 may be configured to determine both the type and amplitude (magnitude), based on the phase angle θn of the metal influence signal generated in the orthogonal coordinate system, which type of metal sample among the plurality of types (Fe, SUS, Non-Fe) and what size of the metal sample among the plurality of metal samples of the same type is greater or smaller based on the boundary information of the distribution area in the orthogonal coordinate system, for example, the positional relationship with multiple points on the boundary lines B1, B2 respectively. In this case, the type and size of the detected metal can be determined quickly and accurately.

Moreover, the second determination unit 36b of the determination unit 36 stores the determination conditions for determining the phase θn of the metal influence signal generated in the orthogonal coordinate system when various metal samples pass through the inspection area Z in the form of a map or a calculation formula for determination for each of plurality of frequency bands set for the frequency of the reference signal or the detection signals Rx, Ry of the detection unit 24, and determines the type of metal that passes through the inspection area Z based on the determination conditions. Therefore, the change in the phase θn of the metal influence signal in response to the change in the frequency of the reference signal can be effectively detected, and the type of metal can be determined more accurately.

In the present embodiment, since the control unit 30 also has the statistics and history processing unit 37 that executes the statistics and history processing of the workpiece W that passed through the inspection area Z based on the determination result of the determination unit 36, it is possible to generate the statistics and history information including the type of the metal at the time of the occurrence of metal contamination. Therefore, more useful statistics and historical information can be obtained.

Furthermore, in the present embodiment, the inspection area Z is arranged downstream of the upstream apparatuses 41, 42 that handle the workpiece W. When the determination unit 36 determines the type of foreign metal contained in the workpiece W, it also determines any upstream apparatus 41 or 42 that can discharge the metal of the determination type and identifies the source of the outflow, so that the cause of the outflow can be easily identified when foreign metal contained occurs. In addition, the statistics and history information in the statistics and history processing unit 37 provides useful maintenance information for the upstream apparatuses 41, 42.

Thus, in the present embodiment, it is possible to provide a metal detection apparatus 10 that can accurately and automatically determine whether a metal passing through the inspection area Z is a magnetic metal or a non-magnetic metal, and at the same time, that can accurately determine multiple types of metals with different degrees of non-magnetism and materials, even if they are non-magnetic.

In the above-mentioned embodiment, the boundary information of the distribution area in the orthogonal coordinates, such as the boundary lines B1, B2, and the like, is shown in a map region corresponding to the orthogonal coordinates of the entire fluctuation region in the specific detection phase of the magnetic field fluctuation signal Sd, and has a curved curve shape so that the phase angle becomes larger on the side of high amplitude (the side where the two components of the orthogonal coordinates become larger) than on the side of low amplitude of the detection signal of the specific article on the map region. However, the boundary information of the distribution area on the orthogonal coordinates may be shown in a map region corresponding to the orthogonal coordinates of the entire fluctuation region in the specific detection phase of the magnetic field fluctuation signal Sd, and may be identified by a boundary calculation formula identifying a fluctuation point on a curved boundary line such that the phase angle becomes larger on the high amplitude side than the low amplitude side of the detection signal of the specific article on the map region. In addition, when it is desired to determine a specific metal type that can be discharged from the upstream apparatuses 41, 42, it may be possible to determine whether the material belongs to any of them by setting a plurality of independent distribution areas specified in the distribution range of a specific type, instead of dividing the distribution range by a boundary line, as already mentioned.

Figure 10:
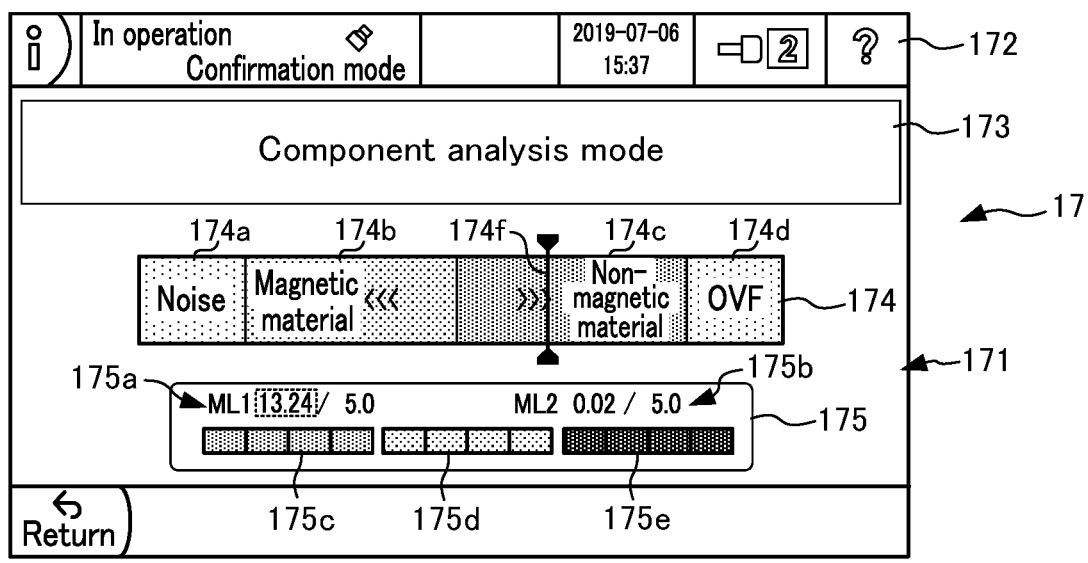
FIG. 10 is a schematic diagram of an example of one display of a display unit in the metal detection apparatus according to the first embodiment of the present invention, and illustrates a case in which a metal type with different magnetism is displayed in a gradation of the color of that type.

FIG. 10 shows an example of a display on the display unit 17 associated with the output processing in the control unit.

As shown in the same figure, in the display screen 171 of the display unit 17, an operating mode display area 172, an operating status display area 173, a type display scale area 174 that displays the different magnetic metal types for the test piece or NG sample being conveyed, and a metal inspection result display area 175 are arranged in order from above to below.

In the operating mode display area 172, the fact that the apparatus is "in operation" and the operation mode, for example, that it is in the "confirmation mode", the date and time, the storage type, and the like, are displayed. In the operating status display area 173, the current operating status, for example, the component analysis in the "confirmation mode" using a test piece, is displayed.

The type display scale area 174 is a type display means of displaying a type of the detected metal, for example, the type of the test piece currently being inspected, and the plural type display areas 174a, 174b, 174c, and 174d for the plurality of metal samples constitute the scale display which display the plurality of phase areas generated by the mutual phase difference generated in the orthogonal coordinate system corresponding to the detection phase of the plurality of metal samples in a predetermined direction and displayed in different color tones.

Specifically, the plurality of type display areas 174a to 174d are displayed corresponding, for example, to one of the "Noise" area 174a, the "magnetic" area 174b, the "non-magnetic" area 174c, and the "OVF (overflow)" area 174d.

Here, the "Noise" area 174a corresponds to the distribution area of the phase angle due to the influence of noise, workpiece or vibration in FIG. 6, for example, the distribution area of the phase angle θd of the peak Pw of the Lissajous figure Hg of the workpiece W itself. In addition, the "magnetic material" area 174b corresponds to a phase angle distribution area of the peak of the Lissajous figure due to the influence of a magnetic material metal such as iron (Fe).

In addition, the "non-magnetic material" area 174c corresponds to the distribution area of the phase angle θn of the peak Pn of the Lissajous figure Hn due to the influence of non-magnetic metals such as stainless steel (SUS), and the like. Here, the phase angle distribution area of the peak of the Lissajous figure due to the influence of non-ferrous metals such as, for example, aluminum (Al), and the like, which are metals other than steel (iron and iron-based alloys), is also included.

The "OVF" area 174d shows an overflow area where the phase angle is so large that it is not effective in detecting metal influence on the magnetic field of the inspection area Z within the phase angle range of every 180 degrees where the magnitude of metal influence can be evaluated from the detection data Dx, Dy.

In the "non-magnetic" area 174c in the same drawing, a pointer 174f is displayed in a different color tone from each type display areas 174a to 174d (here, the difference in color tone is referred to as the difference in shading for the convenience of illustration). This pointer 174f can be moved to the right and left in the figure, which is the extension direction of the type display scale area 174 according to the magnitude of the above-mentioned phase angle θn. Depending on whether the display position on the type display scale area 174 is in the type display areas 174a, 174b, 174c or 174d and the difference in color tone, it is possible to identifiably display the type of the detected metal or the test piece, the presence or absence of magnetism and the degree of magnetism. That is, the pointer 174f may identify and display the phase of the metal currently being detected with respect to the type display areas 174a to 174d of the type display scale area 174.

The metal inspection result display area 175 includes, for example, an ML1 display area 175a that displays the amplitude level of the magnetic field fluctuation due to the influence of magnetic metals in comparison with the determination limit value, an ML2 display area 175b that displays the amplitude level of the magnetic field fluctuation due to the influence of non-magnetic metals in comparison with the determination limit value, and a plurality of display elements 175c, 175d, and 175e that display the calculated value and the determination result based on the determination limit in a visible color and number of lights.

Thus, in the present embodiment, the detection data Dx and Dy, which have a large influence on magnetic and non-magnetic metals, are obtained by quadrature detection of the magnetic field fluctuation signal Sd, which is derived from the passage of the magnetic field of multiple types of metal samples (Fe, SUS, Non-Fe, and the like), and the slope angle θn of the Lissajous figure Hn in the orthogonal coordinate system corresponding to the detection phase is calculated as phase data based on the detection data Dx, Dy, and the calculated phase data is compared with the stored sample signal phase data.

Then, based on the comparison results, the phase distribution area of each metal type that occurs in the orthogonal coordinate system for the plurality of metal samples (Fe, SUS, Non-Fe, and the like) is arranged in the bar-shaped type display scale area 174 that extends in a predetermined direction in an order according to the difference in phase θn of each metal type and in a length (in a predetermined direction) according to the width of phase fluctuation due to the difference in magnetism of the samples of each metal type, and then a pointer display is executed on the type display scale area 174 to identifiably display the phase of the article or metal currently being inspected by the pointer 174f.

Therefore, based on the phase determination result of the metal influence signal generated in the orthogonal coordinate system corresponding to the detection phase, it is possible to identifiably display which of the metal types with different magnetism is the metal passing through the inspection area Z by the pointer 174f and the plurality of type display areas 174a-174d as one of the different color tones.

Moreover, in the present embodiment, not only is the scale display made in the type display scale area 174 in a different color tone for each metal type having different magnetism, but also the above-mentioned difference in phase can be grasped as a display position of the pointer 174f on the scale even within the same type. Therefore, the phase θn of the metal influence signal due to the metal mixed into the object to be inspected can be displayed quantitatively, although indirectly, and the presence or absence of magnetism of the metal and the difference of a finer type can be clearly identified and displayed.

Moreover, in the present embodiment, since the type display scale area 174, which is a type display means, is a bar shape extending in the direction of the above-mentioned phase difference, the difference of the metal type and the magnetism thereof can be more clearly identified and displayed. In addition, in the present embodiment, the different types of magnetism include at least a type of magnetic metal and a type of non-magnetic metal, so that it is possible to accurately indicate whether the metal is a magnetic or non-magnetic metal.

Second Embodiment of the Present Invention

Figure 11:
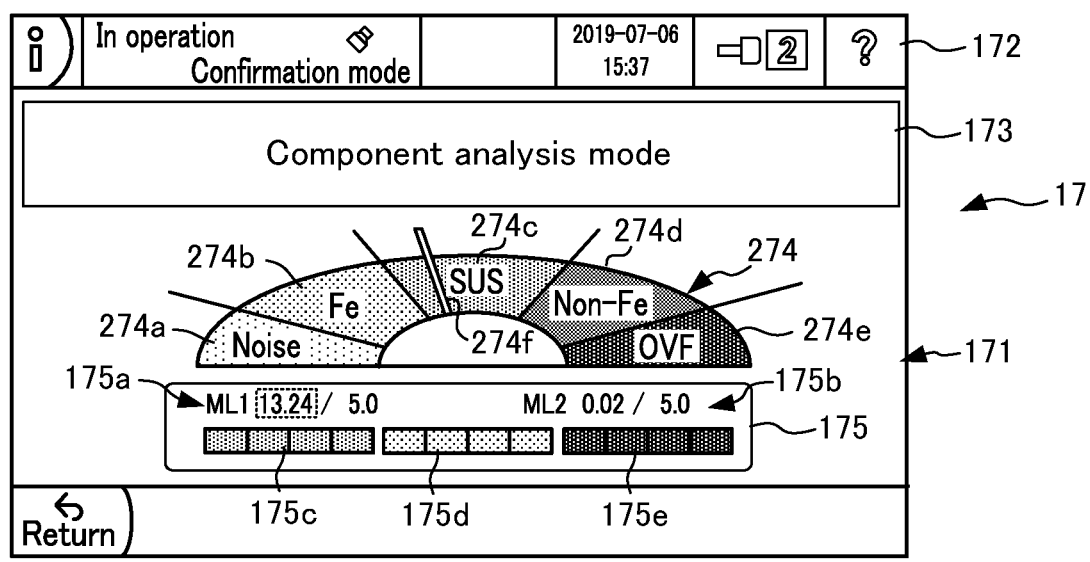
FIG. 11 is a schematic diagram of an example display of each display unit in the metal detection apparatus according to the second embodiment of the present invention, showing a scale display curved into an oval shape.

FIG. 11 shows an example of a metal type display in a display unit in a metal detection apparatus according to the second embodiment of the present invention. Each embodiment described below has almost the same apparatus configuration as the above-mentioned first embodiment, and is the same as the first embodiment except for the differences in memory information and control concerning screen display described below. Therefore, only the differences from the first embodiment are explained below.

As shown in FIG. 11, in the display screen 171 of the display unit 17, an operating mode display area 172, an operating status display area 173, a type display scale area 274, which displays a metal type with different magnetism for a test piece or NG sample being conveyed, and a metal inspection result display area 175 are arranged in order from above to below.

That is, in the display screen 171, the operating mode display area 172, the operating status display area 173, and the metal inspection result display area 175 have the same display mode as in the first embodiment, and the display mode of the metal type for the type display scale area 274 is different from the first embodiment.

Specifically, the type display scale area 274 is a type display means that can display the type of the article or the test piece that passes through the inspection area Z. However, like the same means in the first embodiment, it is not a straight bar-shaped display, but has a band-shaped scale shape curved in a substantially arc shape.

Moreover, the plural type display areas 274a, 274b, 274c, 274d, and 274e for the plural types of metal samples are configured as the "Noise" area 274a, the "Fe" area 274b, the "SUS" area 274c, the "Non-Fe" area 274d, and the "OVF" area 274e having a substantially fan shape and an angular range respectively.

Furthermore, on the type display scale area 274, a pointer display 274f extending in the radial direction of the curvature of the type display scale area 274 is superimposed in a different color tone from the various type display areas 274a to 274e (the difference in color tone is referred to here as the difference in shading for convenience).

The "Noise" area 274a corresponds to the distribution area of the phase angle, for example, the phase angle θd of the peak Pw of the Lissajous figure Hg, due to the influence of noise, workpiece or vibration in FIG. 6. The "Fe" area 274b corresponds to the phase angle distribution area of the peak of the Lissajous figure due to the influence of iron (Fe) and the metal having iron as a main component and magnetism.

"SUS" area 274c corresponds to the distribution area of the phase angle θn of the peak Pn of the Lissajous figure Hn under the influence of non-magnetic metals such as stainless steel (SUS), and "Non-Fe" area 274d corresponds to the distribution area of the phase angle of the peak of the Lissajous figure under the influence of non-ferrous metals such as, for example, aluminum (Al) and brass (Brass), which are metals other than steel (iron and iron-based alloys).

The "OVF (overflow)" area 274e shows an overflow area where the phase angle is excessive to the extent that it is not effective in detecting metal influence on the magnetic field of the inspection area Z within the phase angle range of every 180 degrees where the magnitude of metal influence can be evaluated from the detection data Dx, Dy.

The pointer display 274f can change its angular position so that it moves in the elongated direction of the type display scale area 274 according to the magnitude of the phase angle θn and the like, and can easily and identifiably display the type of the detected metal or the test piece, the presence or absence of magnetism, and the degree of magnetism by the difference of the color tone to the background area and the fact that the display position on the type display scale area 274 is within the region of the type display area 274a, 274b, 274c, 274d or 274e.

In this embodiment, as in the first embodiment, the slope angle (θn) of the Lissajous figure in the orthogonal coordinate system corresponding to the detection phase is calculated as the phase of the metal influence signal based on the detection data Dx, Dy. The phase distribution areas of each metal type in the orthogonal coordinate system are arranged in a type display scale area 274 extending in a predetermined direction in an order according to the difference in phase of each metal type, and in an angular range according to the width of phase fluctuation due to the difference in magnetism of the samples of each metal type, and a pointer display that identifiably display the phase of the article or metal currently being inspected on the scale display are executed.

Therefore, the pointer display 274f and the plurality of type display areas 274a to 274e can be displayed so that the metal passing through the inspection area Z can be identified as one of the different color tones among the plurality of metal types with different magnetism.

Moreover, in the present embodiment, not only is the scale display made in the type display scale area 274 in a different color tone for each metal type having different magnetism, but also the above-mentioned difference in phase can be grasped as a display position of the pointer display 274f on the scale, even within the same type. Therefore, the phase of the detected metal can be displayed quantitatively, although indirectly, and the presence or absence of magnetism of the metal and the difference of a finer type can be clearly identified and displayed.

Moreover, in the present embodiment, since the type display scale area 274, which is a type display means, extends in the direction of the above-mentioned phase difference, the difference of the metal type and the magnetism thereof can be more clearly identified and displayed. In addition, in this embodiment, since the different types of magnetism include at least the type of magnetic metal Fe and the types of non-magnetic metal SUS, Non-Fe, it is possible to display whether the metal is a magnetic or non-magnetic metal accurately and effectively.

Third Embodiment of the Present Invention

Figure 12A:
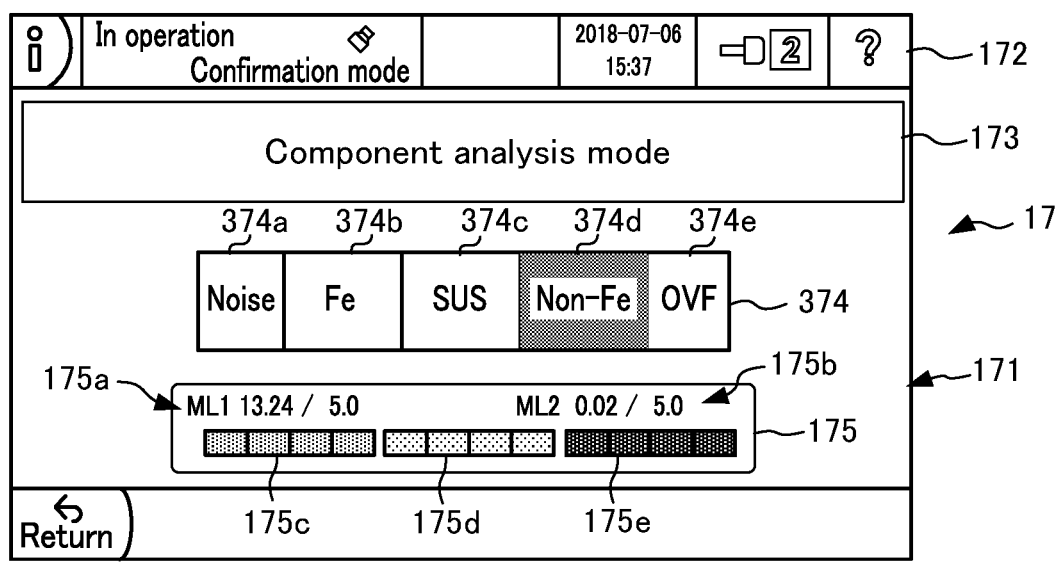
FIG. 12A is a schematic diagram of an example of one display of a display unit in a metal detection apparatus according to the third embodiment of the present invention, showing a bar-shaped, monochromatic scale display.

FIG. 12A shows a display example of the display unit 17 associated with the output processing in the control unit in the third embodiment.

As shown in the same figure, in the display screen 171 of the display unit 17, an operating mode display area 172, an operating status display area 173, a type display scale area 374 for displaying a metal type with different magnetism for a test piece or NG sample being conveyed, and a metal inspection result display area 175 are arranged in order from above to below.

In the display screen 171, the operating mode display area 172, the operating status display area 173, and the metal inspection result display area 175 are in the same display mode as in the first embodiment, and the display mode of the metal type for the type display scale area 374 is different from that of the first embodiment.

Specifically, the type display scale area 374 is a type display means of a monochrome gradation expression, for example, a gray scale, which can display the type of an article or a test piece that passes through the inspection area Z. Also, the type display scale area 374 is composed of multiple type display areas 374a, 374b, 374c, 374d, and 374e for metal samples of multiple types as a "noise" area 374a, a "Fe" area 374b, a "SUS" area 374c, a "Non-Fe" area 374d, and an "OVF" area 374e. Each area 374a to 374e is a phase distribution area similar to the corresponding area of the second embodiment.

Here, the "Non-Fe" area 374d in FIG. 12A is displayed in a different specific shade, while the other type display areas 374a to 374c and 374e have the same shade (for example, white), so that the area display in a specific shade different from the other areas functions as a pointer display to identify the phase area.

The area display in this specific shade can be moved to the right and left in the figure, which is the extension direction of the type display scale area 374 according to the magnitude of the aforementioned phase angle θn, and the type of the detected metal or the test piece can be displayed identifiably by whether the display position on the type display scale area 374 falls into any of the type display areas 374a to 374e.

In the present embodiment, for a plurality of metal samples, the phase distribution areas of each metal type that arise in the orthogonal coordinate system are arranged in a bar-like scale display area extending in a predetermined direction in the order of arrangement according to the difference in phase (θn) of each metal type, and a specific gradation display is performed on the scale display to display identifiably the phase of the article or metal currently being inspected. Therefore, it is possible to display identifiably the type of the metal of different type having different magnetism passing through the inspection area Z.

Fourth Embodiment of the Present Invention

Figure 12B:
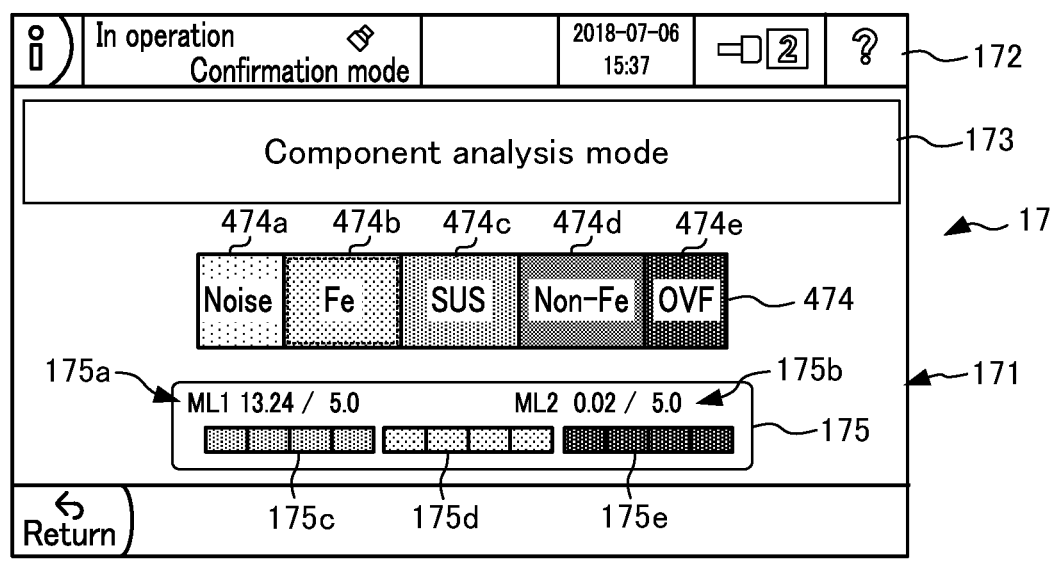
FIG. 12B is a schematic diagram of an example of one display of a display unit in a metal detection apparatus according to the fourth embodiment of the present invention, showing a bar-shaped, multi-colored scale display.

FIG. 12B shows a display example of the display unit 17 associated with the output processing in the control unit in the fourth embodiment. The present embodiment is similar to the third embodiment.

As shown in the same figure, in the present embodiment, in the display screen 171 of the display unit 17, the operating mode display area 172, the operating status display area 173, and the metal inspection result display area 175 have the same display mode as in the case of the first embodiment, whereas the display mode of the type display scale area 474 differs from the first embodiment in the display mode of the metal type.

Specifically, the type display scale area 474 is a means of displaying a type of the article passing through the inspection area Z and the type of the test piece that can be expressed in multiple colors. The type display scale area 474 is composed of "Noise" area 474a, "Fe" area 474b, "SUS" area 474c, "Non-Fe" area 474d, and "OVF" area 474e, wherein a plurality of type display areas 474a, 474b, 474c, 474d, and 474e for the plurality of metal samples are composed. Each area 474a to 474e is a phase distribution area similar to the corresponding area of the second embodiment.

The "Fe" area 474b in FIG. 12B is displayed in an emphasis display mode including different luminance or 3D effect, while the other type display areas 474a and 474c to 474e have the same luminance or shade or other 3D effect, and the like, and the area displayed in the emphasis display mode different from the other areas functions as a pointer display to identify the phase area. The area display in this emphasis display mode can be moved to the right and left in the same figure, which is the extension direction of the type display scale area 474 according to the magnitude of the above-mentioned phase angle θn, and the type of the detected metal or the test piece can be displayed identifiably depending on in which of type display areas 474a to 474e on the type display scale area 474 the display position of the emphasis display enters.

In the present embodiment, for a plurality of metal samples, the phase distribution areas of each metal type that arise in the orthogonal coordinate system are arranged in a bar-like scale display area extending in a predetermined direction in the order of arrangement according to the difference in phase (θn) of each metal type, and a specific gradation display is performed on the scale display to display identifiably the phase of the article or metal currently being inspected. Therefore, it is possible to display identifiably the type of the metal of different type having different magnetism passing through the inspection area Z.

In the above-mentioned first embodiment, the boundary information of the distribution area in the orthogonal coordinates, such as the boundary lines B1, B2, and the like, is shown in a map region corresponding to the orthogonal coordinates of the entire fluctuation region in the specific detection phase of the magnetic field fluctuation signal Sd, and has a curved curve shape so that the phase angle becomes larger on the side of high amplitude (the side where the two components of the orthogonal coordinates become larger) than on the side of low amplitude of the detection signal of the specific article on the map region. However, the boundary information of the distribution area on the orthogonal coordinates may be shown in a map region corresponding to the orthogonal coordinates of the total fluctuation area in the specific detection phase of the magnetic field fluctuation signal Sd, and may be identified by a boundary calculation formula identifying a fluctuation point on a curved boundary line such that the phase angle becomes larger on the high amplitude side than the low amplitude side of the detection signal of the specific article on the map region.

As described above, the present invention can provide a metal detection apparatus that can accurately and automatically determine whether a metal passing through the inspection area is a magnetic metal or a non-magnetic metal, or can accurately determine multiple types of metals with different degrees of non-magnetism and materials, even if they are non-magnetic, and can also provide a metal detection apparatus that can accurately and automatically determine whether a metal passing through the inspection area is a magnetic or non-magnetic metal, and identify and display the type of metal. The present invention is useful for metal detection apparatus in general to detect metals or metal components in an object to be inspected based on the magnetic field fluctuation when the object to be inspected passes through an alternating magnetic field.

EXPLANATION OF REFERENCE NUMERALS 10 metal detection apparatus
12 conveyor
14 inspection head
14a aperture
15 article detection sensor
16 operation input unit
17 display unit
21 signal generator (reference signal generator, magnetic field generator)
22 transmitting coil (magnetic field generator)
23 differential detector (magnetic field detection unit)
23a, 23b receiving coil
24 detection unit (detection circuit unit)
24a, 24b mixer
25a, 25b band-pass filter
26a, 26b phase shifter
27a, 27b A/D converter
30 control unit
31 setting unit
32 first memory unit
33 second memory unit
34 third memory unit
35 phase correction unit
36 determination unit
36a first determination unit (unit determining whether there is a metal presence or absence in the workpiece W)
36b second determination unit (phase determination unit)
36c third determination unit (metal type determination unit, amplitude determination unit)
37 statistics and history processing unit
41, 42 upstream apparatus
171 display screen
172 operating mode display area
173 operating status display area
174, 274, 374, 474 type display scale area (type display unit)
174a, 174b, 174c, 174d type display area
174f, 274f pointer (pointer display)
175 metal inspection result display area
274a, 274b, 274c, 274d, 274e type display area
374a, 374b, 374c, 374d, 374e type display area
474a, 474b, 474c, 474d, 474e type display area
B1, B2 boundary line (boundary information)
Dx, Dy detection data
Lg, Ln amplitude
Rx detection signal of the first fluctuation component
Ry detection signal of the second fluctuation component
Sd differential detection signal (magnetic field fluctuation signal)
Tp1, Tp2 metal sample (test piece)
Va, Vb induced voltage
X detection signal (Signal after the first fluctuation component is filtered)
Y detection signal (Signal after the second fluctuation component is filtered)
Z inspection area
θa, θb, θc distribution angle
θn phase (phase angle, slope angle)
θd phase (phase angle)
τ transmission signal cycle

The invention claimed is:

1. A metal detection apparatus, comprising:
a magnetic field generator that generates an alternating magnetic field based on a reference signal in an inspection area through which an object to be inspected passes;
a magnetic field detection unit that detects the fluctuation of the alternating magnetic field in the inspection area due to the passage of the object to be inspected and outputs a magnetic field fluctuation signal;
a detection circuit unit that performs detection processing to detect first fluctuation component of the magnetic field fluctuation signal on the in-phase side of the reference signal and second fluctuation component of the magnetic field fluctuation signal on the quadrature phase side of the reference signal at two detection phases that are quadrature to each other; and
a determination unit that executes a determination process to detect metals contained in the object to be inspected based on the first fluctuation component and the second fluctuation component detected by the detection circuit unit, wherein the determination unit has:
- a phase determination unit determining the difference between sample signal phase data obtained in advance from the magnetic field fluctuation signal detected by passing through various metal samples out of the metal samples of various types, and a signal phase data of the object to be inspected obtained from the magnetic field fluctuation signal detected by passing through the object to be inspected in which a metal is contained,
- a metal type determination unit determining the type of the metal contained in the object to be inspected based on the determination result of the phase determination unit, and
- an amplitude determination unit determining the difference between sample signal amplitude data obtained in advance from the magnetic field fluctuation signals detected by passing through a plurality of metal samples of the same type with different sizes for each type of the various metal samples and a signal amplitude data of the object to be inspected obtained from the magnetic field fluctuation signal detected by passing through the object to be inspected in which the metal is contained, and wherein the type and size of the metal contained in the object to be inspected are determined based on the determination result of the phase determination unit and the determination result of the amplitude determination unit.

2. The metal detection apparatus according to claim 1, wherein the metal type determination unit discriminates the type and size of the metal based on boundary information of the distribution area on orthogonal coordinates set in advance based on the sample signal phase data, the sample signal amplitude data obtained in advance for the plural metal samples of the same type, the signal phase data of the object to be inspected and the signal amplitude data of the object to be inspected, and wherein the boundary information includes curved boundary line information that can determine the distribution area.

3. The metal detection apparatus according to claim 1, wherein the phase determination unit of the determination unit stores determination conditions for determining differences in the sample signal phase data for each plurality of frequency bands set for the frequency of the reference signal, and determines the type of metal passing through the inspection area based on the determination conditions.

4. A metal detection apparatus, comprising:
- a magnetic field generator that generates an alternating magnetic field based on a reference signal in an inspection area through which an object to be inspected passes;
- a magnetic field detection unit that detects the fluctuation of the alternating magnetic field in the inspection area due to the passage of the object to be inspected and outputs a magnetic field fluctuation signal;
- a detection circuit unit that performs detection processing to detect first fluctuation component of the magnetic field fluctuation signal on the in-phase side of the reference signal and second fluctuation component of the magnetic field fluctuation signal on the quadrature phase side of the reference signal at two detection phases that are quadrature to each other;
- a determination unit that executes a determination process to detect metals contained in the object to be inspected based on the first fluctuation component and the second fluctuation component detected by the detection circuit unit; and
- a statistics and history processing unit that executes statistics and history processing of the object to be inspected that has passed through the inspection area based on the determination results of the determination unit, wherein the determination unit has:
- a phase determination unit determining the difference between sample signal phase data obtained in advance from the magnetic field fluctuation signal detected by passing through various metal samples out of the metal samples of various types, and a signal phase data of the object to be inspected obtained from the magnetic field fluctuation signal detected by passing through the object to be inspected in which a metal is contained, and
- a metal type determination unit determining the type of the metal contained in the object to be inspected based on the determination result of the phase determination unit.

5. The metal detection apparatus according to claim 1, wherein the inspection area is disposed downstream from an upstream apparatus for handling the object to be inspected, and wherein when the determination unit determines the type of a contaminant metal contained in the object to be inspected, the determination unit identifies an outflow source of the contaminant metal contained in the object to be inspected based on the correspondence between the predetermined type of metal and the upstream apparatus probable to cause the outflow of the contaminant metal of the type.

6. A metal detection apparatus, comprising:
- a magnetic field generator that generates an alternating magnetic field based on a reference signal in an inspection area through which an object to be inspected passes;
- a magnetic field detection unit that detects the fluctuation of the alternating magnetic field in the inspection area due to the passage of the object to be inspected and outputs a magnetic field fluctuation signal;
- a detection circuit unit that performs detection processing to detect first fluctuation component of the magnetic field fluctuation signal on the in-phase side of the reference signal and second fluctuation component of the magnetic field fluctuation signal on the quadrature phase side of the reference signal at two detection phases that are quadrature to each other; and
- a determination unit that executes a determination process to detect metals contained in the object to be inspected based on the first fluctuation component and the second fluctuation component detected by the detection circuit unit, wherein the determination unit has:
- a phase determination unit determining the difference between sample signal phase data obtained in advance from the magnetic field fluctuation signal detected by passing through various metal samples out of the metal samples of various types, and a signal phase data of the object to be inspected obtained from the magnetic field fluctuation signal detected by passing through the object to be inspected in which a metal is contained, a metal type determination unit determining the type of the metal contained in the object to be inspected based on the determination result of the phase determination unit, wherein the determination unit has a first operation mode for detecting the metal contained into the object to be inspected and determining the type of the metal based on each fluctuation component detected by the detection circuit unit, and a second operation mode for at least setting the operating conditions or confirming the operating status of the detection circuit unit by using the metal sample, and wherein the determination unit determines the type of metal contained in the object to be inspected in the first operation mode, and the type of the metal sample in the second operation mode.

7. The metal detection apparatus according to claim 1, further comprising a type display unit for displaying the metal contained in the object to be inspected in one of different color tones according to the different types of magnetism based on the determination result of the phase determination unit.

8. The metal detection apparatus according to claim 7, wherein the type display unit executes a scale display in which plural phase areas resulting from mutual phase differences in the orthogonal coordinate system corresponding to the two detection phases are aligned in a predetermined direction and displayed in different color tones with respect to the plurality of metal samples, and a discriminatory display in which the phase of the metal currently being detected can be displayed identifiably on the scale display.

9. The metal detection apparatus according to claim 8, wherein the type display unit displays the scale display in a bar-like scale shape extending in the predetermined direction.

10. The metal detection apparatus according to claim 7, wherein the different types of magnetism include at least a magnetic metal type and a non-magnetic metal type.

11. The metal detection apparatus according to claim 2, wherein the phase determination unit of the determination unit stores determination conditions for determining differences in the sample signal phase data for each plurality of frequency bands set for the frequency of the reference signal, and determines the type of metal passing through the inspection area based on the determination conditions.

12. The metal detection apparatus according to claim 2, further comprising a statistics and history processing unit that executes statistics and history processing of the object to be inspected that has passed through the inspection area based on the determination results of the determination unit.

13. The metal detection apparatus according to claim 2, wherein the inspection area is disposed downstream from an upstream apparatus for handling the object to be inspected, and when the determination unit determines the type of a contaminant metal contained in the object to be inspected, the determination unit identifies an outflow source of the contaminant metal contained in the object to be inspected based on the correspondence between the predetermined type of metal and the upstream apparatus probable to cause the outflow of the contaminant metal of the type.

14. The metal detection apparatus according to claim 2, wherein the determination unit has a first operation mode for detecting the metal contained in the object to be inspected and determining the type of the metal based on each fluctuation component detected by the detection circuit unit, and a second operation mode for at least setting the operating conditions or confirming the operating status of the detection circuit unit by using the metal sample, and wherein the determination unit determines the type of metal contained in the object to be inspected in the first operation mode, and the type of the metal sample in the second operation mode.

15. The metal detection apparatus according to claim 2, further comprising a type display unit for displaying the metal contained in the object to be inspected in different color tones according to the different types of magnetism based on the determination result of the phase determination unit.

16. The metal detection apparatus according to claim 11, further comprising a type display unit for displaying the metal contained in the object to be inspected in different color tones according to the different types of magnetism based on the determination result of the phase determination unit.

17. The metal detection apparatus according to claim 12, further comprising a type display unit for displaying the metal contained in the object to be inspected in different color tones according to the different types of magnetism based on the determination result of the phase determination unit.

18. The metal detection apparatus according to claim 13, further comprising a type display unit for displaying the metal contained in the object to be inspected in different color tones according to the different types of magnetism based on the determination result of the phase determination unit.

19. The metal detection apparatus according to claim 14, further comprising a type display unit for displaying the metal contained in the object to be inspected in different color tones according to the different types of magnetism based on the determination result of the phase determination unit.

20. The metal detection apparatus according to claim 4, wherein the determination unit further comprises an amplitude determination unit determining the difference between sample signal amplitude data obtained in advance from the magnetic field fluctuation signals detected by passing through the plurality of metal samples of the same type with different sizes for each type of the plurality of metal samples and a signal amplitude data of the object to be inspected obtained from the magnetic field fluctuation signal detected by passing through the object to be inspected in which the metal is contained, and wherein the type and size of the metal contained in the object to be inspected are determined based on the determination result of the phase determination unit and the determination result of the amplitude determination unit.

21. The metal detection apparatus according to claim 4, wherein the inspection area is disposed downstream from an upstream apparatus for handling the object to be inspected, and wherein when the determination unit determines the type of a contaminant metal contained in the object to be inspected, the determination unit identifies an outflow source of the contaminant metal contained in the object to be inspected based on the correspondence between the predetermined type of metal and the upstream apparatus probable to cause the outflow of the contaminant metal of the type.

22. The metal detection apparatus according to claim 6,
wherein the determination unit further comprises an amplitude determination unit determining the difference between sample signal amplitude data obtained in advance from the magnetic field fluctuation signals detected by passing through the plurality of metal samples of the same type with different sizes for each type of the plurality of metal samples and a signal amplitude data of the object to be inspected obtained from the magnetic field fluctuation signal detected by passing through the object to be inspected in which the metal is contained, and
wherein the type and size of the metal contained in the object to be inspected are determined based on the determination result of the phase determination unit and the determination result of the amplitude determination unit.

* * * * *